(12) United States Patent
Hsu et al.

(10) Patent No.: US 11,742,320 B2
(45) Date of Patent: Aug. 29, 2023

(54) WAFER BONDING ALIGNMENT

(71) Applicant: Taiwan Semiconductor Manufacturing Company, Ltd., Hsinchu (TW)

(72) Inventors: Hsi-Cheng Hsu, Taichung (TW); Jui-Chun Weng, Taipei (TW); Ching-Hsiang Hu, Taipei (TW); Ji-Hong Chiang, Changhua (TW); Kuo-Hao Lee, Hsinchu (TW); Chia-Yu Lin, Taoyuan (TW); Chia-Chun Hung, Chiayi (TW); Yen-Chieh Tu, Taichung (TW); Chien-Tai Su, Hsinchu (TW); Hsin-Yu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 239 days.

(21) Appl. No.: 17/249,758

(22) Filed: Mar. 11, 2021

(65) Prior Publication Data
US 2022/0293557 A1 Sep. 15, 2022

(51) Int. Cl.
*H01L 23/00* (2006.01)
*H01L 23/544* (2006.01)
*H01L 25/065* (2023.01)

(52) U.S. Cl.
CPC ............ *H01L 24/94* (2013.01); *H01L 23/544* (2013.01); *H01L 23/562* (2013.01); *H01L 24/32* (2013.01); *H01L 25/0657* (2013.01)

(58) Field of Classification Search
CPC ... H01L 24/94; H01L 23/562; H01L 25/0657; H01L 23/544; H01L 24/32; H01L 2223/54426; H01L 2223/54453; H01L 2224/32145; H01L 2224/83121; H01L 2225/06565; H01L 2225/06593; H01L 24/83; H01L 2224/83801; H01L 2224/83805; H01L 2224/83894; H01L 2924/14; H01L 25/50; H01L 21/50
See application file for complete search history.

(56) References Cited

U.S. PATENT DOCUMENTS

| 6,713,843 B2 | 3/2004 | Fu |
| 9,299,612 B2 * | 3/2016 | Wu ........................ H01L 23/585 |
| 10,134,793 B1 * | 11/2018 | Casey ................... H01L 23/544 |

(Continued)

FOREIGN PATENT DOCUMENTS

TW 529097 B 4/2003

*Primary Examiner* — Thanh T Nguyen
(74) *Attorney, Agent, or Firm* — Harrity & Harrity, LLP

(57) ABSTRACT

Alignment of devices formed on substrates that are to be bonded may be achieved through the use of scribe lines between the devices, where the scribe lines progressively increase or decrease in size from a center to an edge of one or more of the substrates to compensate for differences in the thermal expansion rates of the substrates. The devices on the substrates are brought into alignment as the substrates are heated during a bonding operation due to the progressively increased or decreased sizes of the scribe lines. The scribe lines may be arranged in a single direction in a substrate to compensate for thermal expansion along a single axis of the substrate or may be arranged in a plurality of directions to compensate for actinomorphic thermal expansion.

14 Claims, 18 Drawing Sheets

(56) References Cited

U.S. PATENT DOCUMENTS

| | | | |
|---|---|---|---|
| 2008/0286938 A1* | 11/2008 | Pu | H01L 21/78 |
| | | | 257/E21.211 |
| 2010/0308455 A1 | 12/2010 | Kim et al. | |
| 2013/0037220 A1 | 2/2013 | Kim | |
| 2021/0066171 A1* | 3/2021 | Kim | H01L 24/09 |
| 2022/0181208 A1* | 6/2022 | Tian | H01L 24/27 |

* cited by examiner

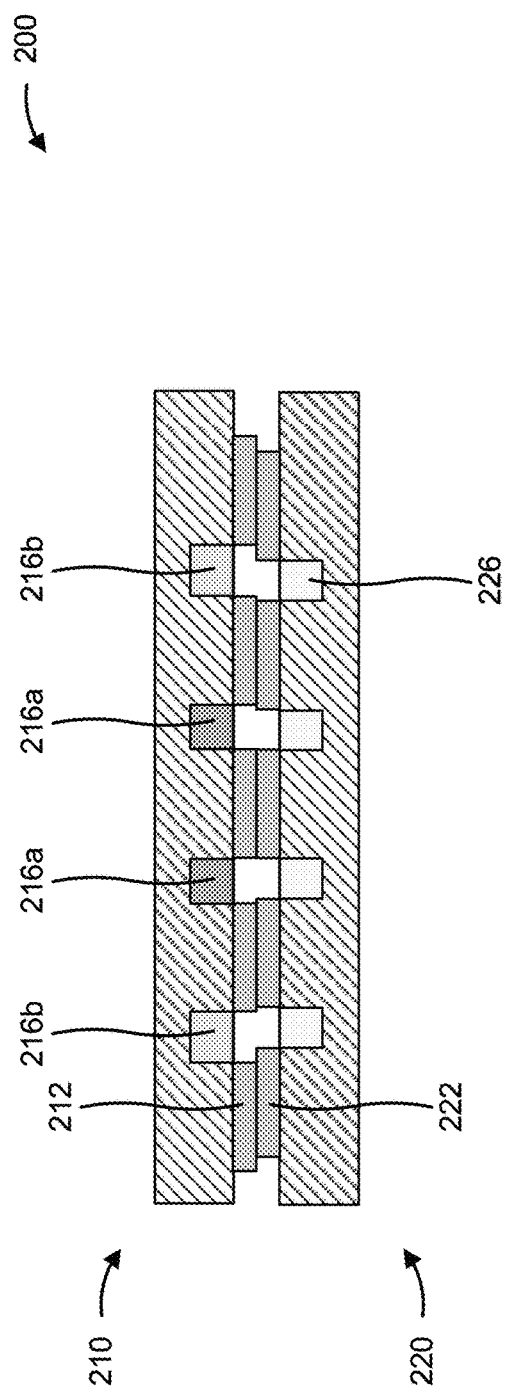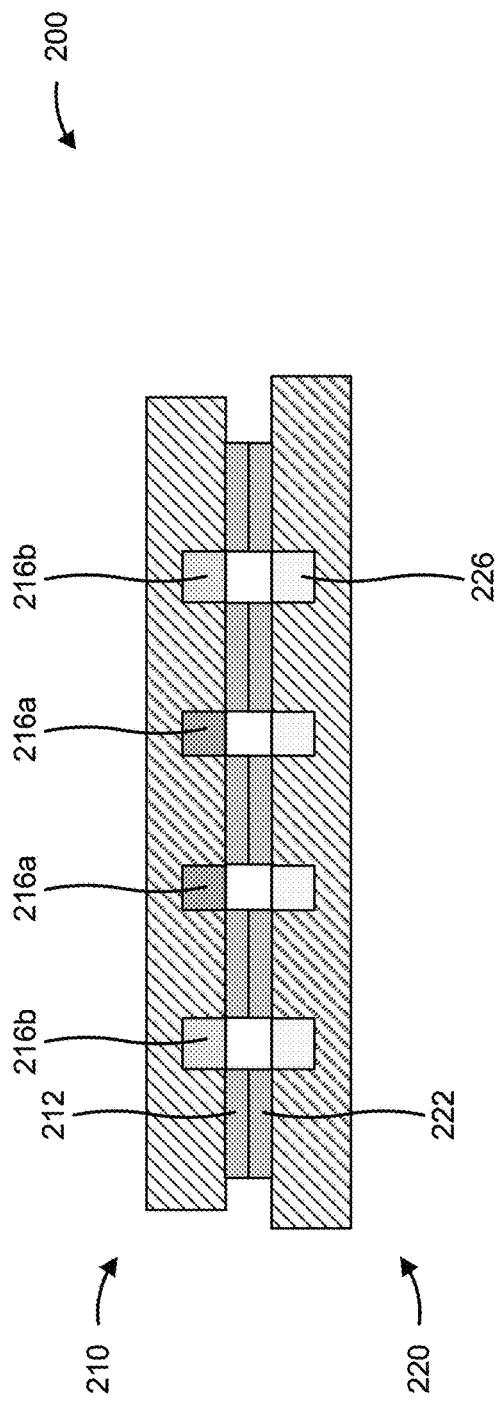

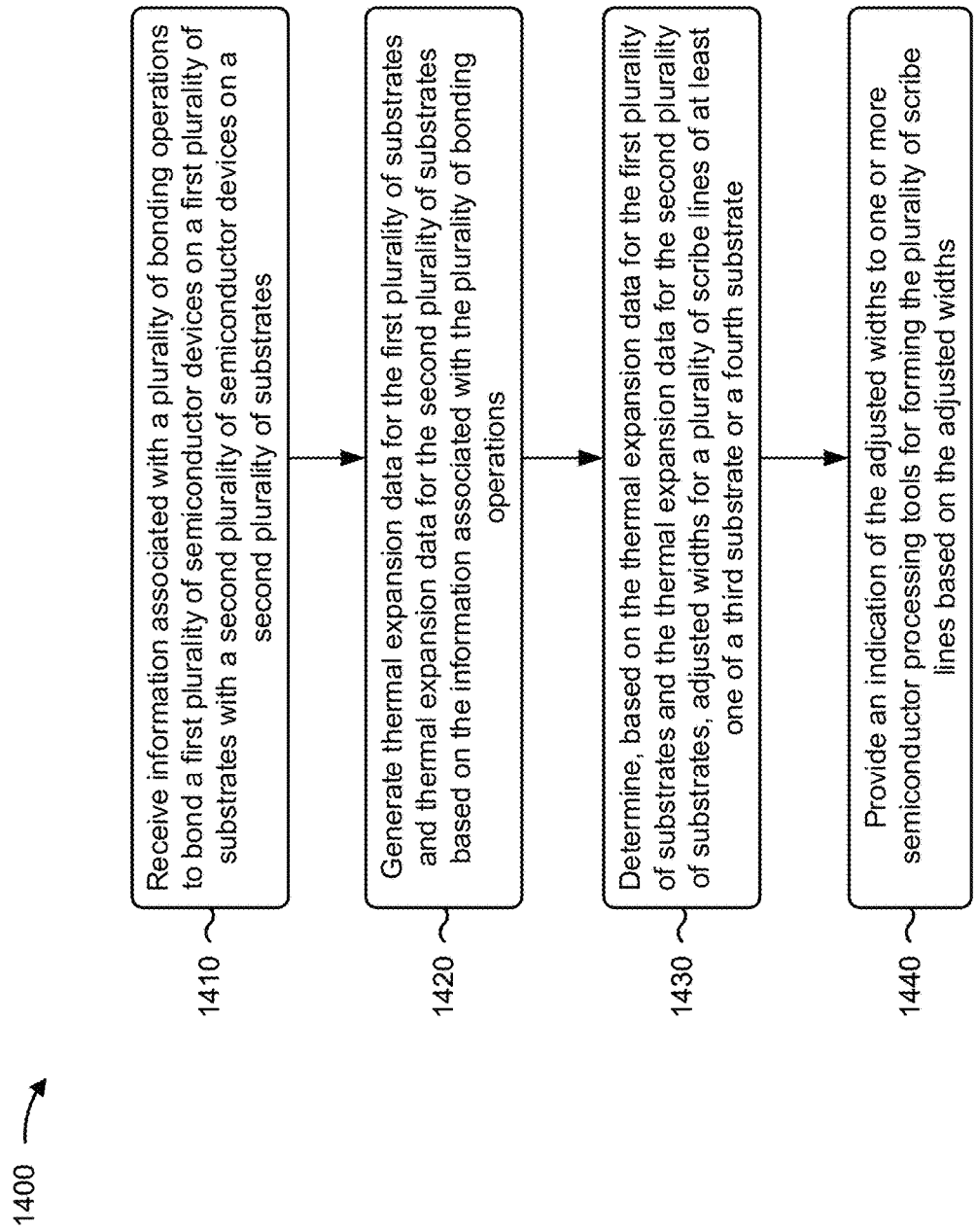

WAFER BONDING ALIGNMENT

BACKGROUND

Bonding in the semiconductor industry is a technique that may be used to form stacked semiconductor devices and three-dimensional integrated circuits. Some examples of bonding include wafer to wafer bonding, die to wafer bonding, and die to die bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C, 3-9, and 10A-10D are diagrams of example implementations described herein.

FIGS. 12-14 are flowcharts of example processes relating to wafer bonding alignment.

DETAILED DESCRIPTION

Figure 1:
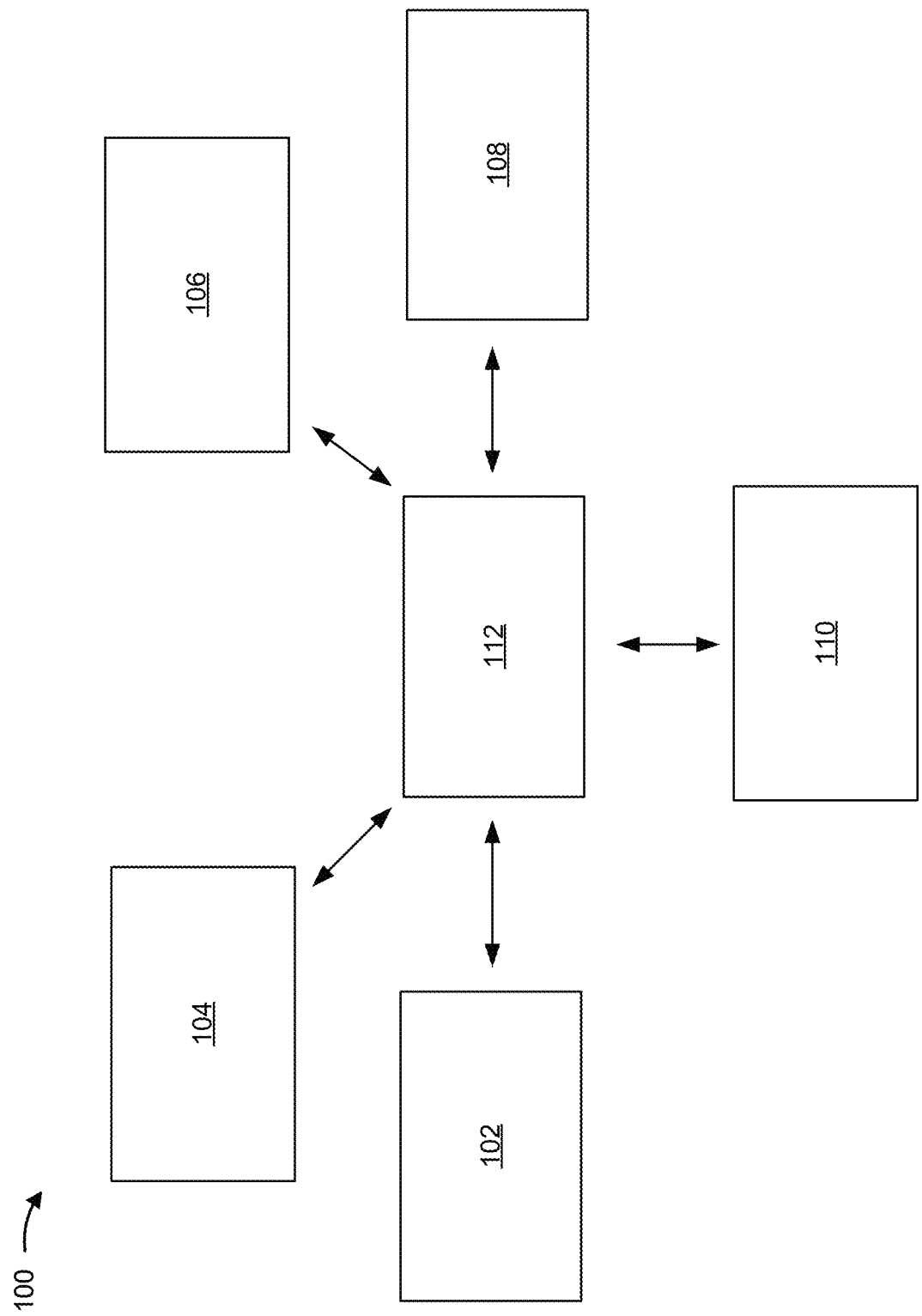
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some semiconductor bonding techniques include heating substrates (e.g., semiconductor wafers) to an elevated temperature. Examples include fusion bonding, eutectic bonding, and hybrid bonding. Substrates may expand in size during a bonding procedure due to thermal expansion as the substrates are heated as part of the bonding procedure. Some substrates may expand more than other substrates. If substrates having different expansion rates are bonded together, the differences in the expansion rates may result in the devices and/or structures formed thereon to be misaligned. This may cause poor device connections between the substrates, may result in reduced bonding strength between the substrates, may result in weakened structural integrity of the resulting three-dimensional integrated circuits, may result in poor quality electrical connections, and/or may result in device failures.

Some implementations described herein provide techniques and apparatuses for wafer bonding alignment. As described herein, bonding alignment of devices formed on substrates that are to be bonded may be achieved through the use of scribe lines between the devices, where the scribe lines progressively increase or decrease in size from a center to an edge of one or more of the substrates to compensate for differences in the thermal expansion rates of the substrates. The devices on the substrates are brought into alignment as the substrates are heated during a bonding operation due to the progressively increased or decreased sizes of the scribe lines. The scribe lines may be arranged in a single direction in a substrate to compensate for thermal expansion along a single axis of the substrate or may be arranged in a plurality of directions to compensate for actinomorphic thermal expansion. In this way, the techniques and apparatuses described herein may reduce device pattern misalignment, may increase bonding strength between substrates that are bonded, may increase the structural integrity and electrical connections of the devices, and/or may reduce device failures of the substrates.

FIG. 1 is a diagram of an example environment 100 in which systems and/or methods described herein may be implemented. As shown in FIG. 1, environment 100 may include a plurality of semiconductor processing tools 102-110 and a wafer/die transport tool 112. The plurality of semiconductor processing tools 102-110 may include a deposition tool 102, an exposure tool 104, a developer tool 106, an etch tool 108, a bonding tool 110, and/or another type of semiconductor processing tool. The tools included in example environment 100 may be included in a semiconductor clean room, a semiconductor foundry, a semiconductor processing and/or manufacturing facility, and/or in another type of semiconductor processing environment.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or another type of UV source), and/or an x-ray source, an electron beam (e-beam) source, among other examples. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of a the substrate using a plasma etch or a plasma-assisted etch, which may involve using an ionized gas to isotopically or directionally etch the one or more portions.

The bonding tool 110 is a semiconductor processing tool that is capable of bonding two or more substrates (e.g., two or more semiconductor substrates, two or more semiconductor wafers, two or more semiconductor devices) together. For example, the bonding tool 110 may include a eutectic bonding tool that is capable of forming a eutectic bond between two or more substrates together by heating the two or more substrates to form a eutectic system between the materials of the two or more substrates. As another example, the bonding tool 110 may include a fusion bonding tool, which may form a direct bond between two or more substrates (e.g., without the use of additional intermediate layers between the two or more substrates) by pre-bonding the substrates (e.g., at or near room temperature) and annealing the substrates to complete the direct bond. In some implementations, the bonding tool 110 bonds two or more substrates using a combination of bonding techniques, which may be referred to as hybrid bonding.

Wafer/die transport tool 112 includes a mobile robot, a robot arm, a tram or rail car, an overhead hoist transport (OHT) system, an automated material handling system (AMHS), and/or another type of device that are used to transport wafers and/or dies between semiconductor processing tools 102-110 and/or to and from other locations such as a wafer rack, a storage room, and/or the like. In some implementations, wafer/die transport tool 112 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2A:
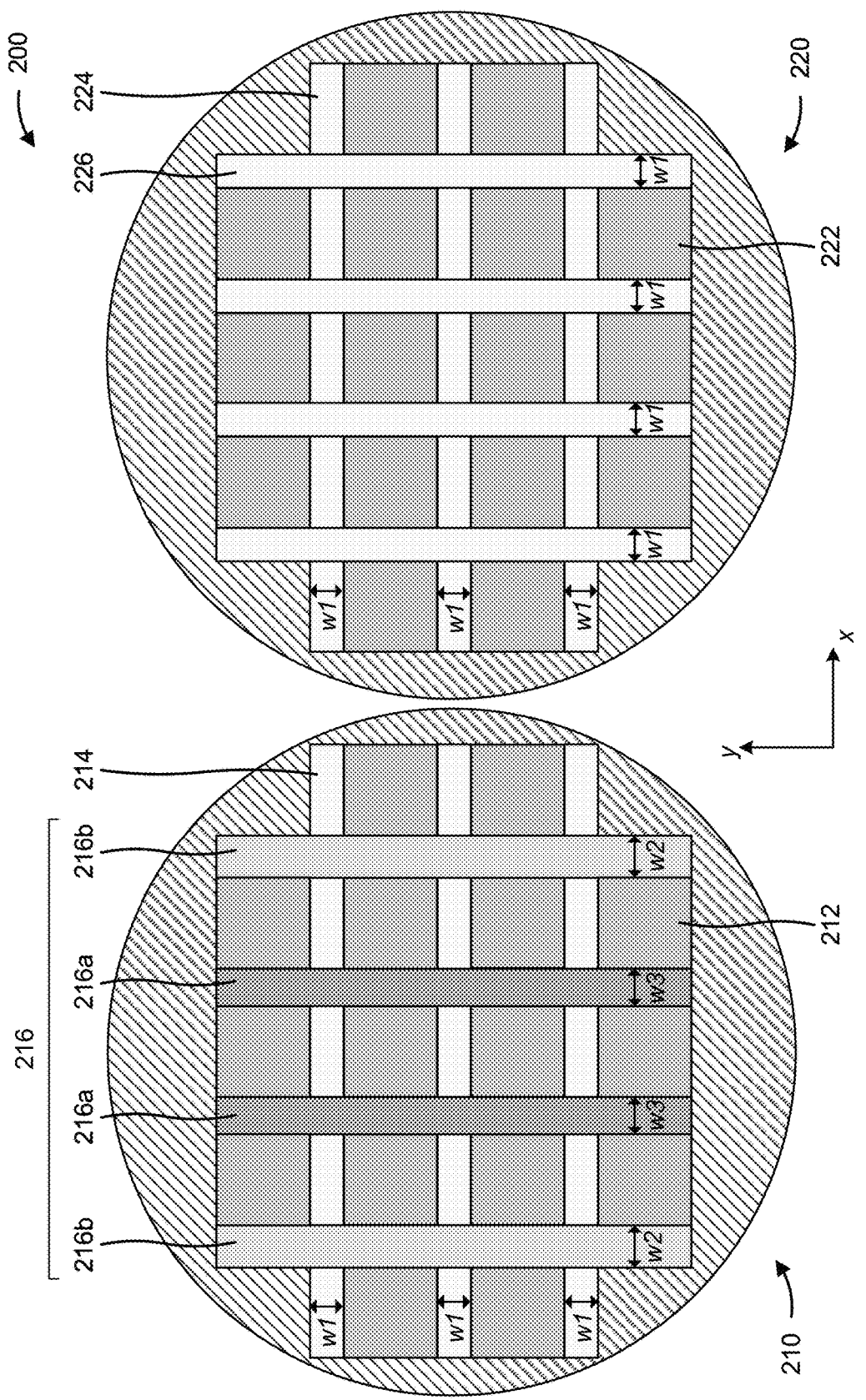

FIGS. 2A-2C are diagrams of an example implementation 200 described herein. The example implementation 200 may include an example of progressively sized scribe lines that are included on a single substrate of two substrates that are to be bonded. Moreover, the progressively sized scribe lines may be included in a single direction in the substrate to compensate for thermal expansion of the substrate in the single direction. In this way, the progressively sized scribe lines may be used to achieve approximate alignment of semiconductor devices on the two substrates in the single direction.

FIG. 2A illustrates a top-down view (or plan view) of a substrate 210 and a substrate 220 that are to be bonded. The substrate 210 and the substrate 220 may be bonded using one or more of the bonding techniques described herein, such as eutectic bonding, fusion (or direct) bonding, hybrid bonding, or another semiconductor substrate bonding technique. The substrate 210 and the substrate 220 may each include a semiconductor wafer, a semiconductor substrate, or another type of substrate in and/or on which semiconductor devices may be formed. The substrate 210 and the substrate 220 may each be formed of silicon (Si), a material including silicon, a III-V compound semiconductor material such as gallium arsenide (GaAs), a silicon on insulator (SOI), or another type of semiconductor material. The substrate 210 and the substrate 220 may each be approximately round and may each include a 200 millimeter wafer (e.g., a wafer that is approximately 200 millimeters in diameter), a 300 millimeter wafer (e.g., a wafer that is approximately 300 millimeters in diameter), or another sized wafer.

As shown in FIG. 2A, the substrate 210 may include a plurality of semiconductor devices 212, and the substrate 220 may include a plurality of semiconductor devices 222. The semiconductor devices 212 and 222 may be formed by one or more semiconductor processing techniques described herein. Respective pairs of the semiconductor devices 212 and 222 may be formed into three-dimensional semiconductor devices that include transistors (e.g., planar transistors, fin field effect transistors (finFETs), gate all around (GAA) transistors), memory devices, micro electro-mechanical systems (MEMs), application specific integrated circuits (ASICs), system on chips (SoCs), and/or other types of semiconductor devices by bonding the substrate 210 and the substrate 220.

The semiconductor devices 212 may be arranged in a grid on the substrate 210 such that a plurality of scribe lines 214 separate rows (or columns) of the semiconductor devices 212, and a plurality of scribe lines 216 separate columns (or rows) of the semiconductor devices 212. The scribe lines 214 may be formed in a first direction (e.g., along the x-axis shown in FIG. 2A) in the substrate 210, and the scribe lines 216 may be formed in a second (e.g., perpendicular) direction (e.g., along the y-axis shown in FIG. 2A) in the substrate 210 such that the scribe lines 214 and the scribe lines 216 intersect at various locations across the substrate 210. Similarly, the semiconductor devices 222 may be arranged in a grid on the substrate 220 such that a plurality of scribe lines 224 separate rows (or columns) of the semiconductor devices 222, and a plurality of scribe lines 226 separate columns (or rows) of the semiconductor devices 222. The scribe lines 224 may be formed in a first direction (e.g., along the x-axis shown in FIG. 2A) in the substrate 220, and the scribe lines 226 may be formed in a second (e.g., perpendicular) direction (e.g., along the y-axis shown in FIG. 2A) in the substrate 220 such that the scribe lines 224 and the scribe lines 226 intersect at various locations across the substrate 220.

A scribe line may include a trench, recess, layer, and/or other structure that functions as a guide for cutting a substrate into a plurality of individual dies. For example, the scribe lines 214 in the substrate 210 and the scribe lines 224 in the substrate 220 may be used as guides for cutting (or dicing) pairs of semiconductor devices 212 and 222 into individual dies in a first direction (e.g., along the x-axis shown in FIG. 2A) of the substrate 210 and the substrate 220. As another example, the scribe lines 216 in the substrate 210 and the scribe lines 226 in the substrate 220 may be used as guides for cutting (or dicing) pairs of semiconductor devices 212 and 222 into individual dies in a second direction (e.g., along the y-axis shown in FIG. 2A) of the substrate 210 and the substrate 220. Moreover, the scribe lines 214, 216, 224, and 226 may provide buffer areas between the semiconductor devices 212 and 222 to accommodate the kerf (or blade width) of a die cutting device so that the die cutting device can cut the semiconductor devices 212 and 222 into individual dies without cutting into the areas of the semiconductor devices 212 and 222. The scribe lines 214, 216, 224, and/or 226 may include other features, such as lithography alignment marks, overlay marks, thickness measurement structures, electrical test points, and/or other features to assist in the manufacturing of the semiconductor devices 212 and 222.

The scribe lines 214, 216, 224, and/or 226 may be formed by various semiconductor fabrication processes. In some implementations, the deposition tool 102 forms a photoresist layer on the substrate 210, the exposure tool 104 exposes the photoresist layer to a radiation source to pattern the photoresist layer, the developer tool 106 develops and removes portions of the photoresist layer to expose the pattern, and the etch tool 108 etches portions of substrate 210 to form openings or recesses in the substrate 310. In some implementations, the deposition tool 102 deposits one or more layers in the openings or recesses using various PVD techniques, CVD techniques and/or ALD techniques, such as sputtering, PECVD, HDP-CVD, SACVD, and/or PEALD, among other examples. In some implementations, one or more layers formed in the scribe lines 214, 216, 224, and/or 226 may be etched (e.g., using the etch tool 108) using techniques such as poly etching, metal etching, and/or another type of etching technique.

As further shown in FIG. 2A, each of the scribe lines 214, 216, 224, and 226 may have a particular width along a short dimension of the scribe lines 214, 216, 224, and 226. The scribe lines 214, 224, and 226 may all have a similar width (w1), which may be in a range of approximately 60 microns to approximately 80 microns or in a range of approximately 30 microns to approximately 100 microns, among other examples.

The substrate 210 and/or the substrate 220 may increase in diameter during a bonding operation due to thermal expansion of the substrate 210 and/or the substrate 220. As an example, a substrate may expand by approximately 10 microns to approximately 100 microns for a 200 millimeter substrate. The expansion rate of a substrate may be based on various factors and/or attributes of the substrate, such as the size of the substrate, the material composition of the substrate, and/or the structural composition of the substrate (e.g., more compressive stress films may induce lower expansion rates), among other examples.

The substrate 210 may be referred to as a low expansion wafer and the substrate 220 may be referred to as a high expansion wafer in that the substrate 220 may have an expansion rate that is greater relative to the expansion rate of the substrate 210. Accordingly, the scribe lines 216 may have widths that are greater relative to the width (w1) of the scribe lines 226 (and the scribe lines 214 and 224) to compensate for the greater thermal expansion of the substrate 220 relative to the thermal expansion of the substrate 210. The increased widths of the scribe lines 216 relative to the scribe lines 226 may result in the semiconductor devices 212 and the semiconductor devices 222 starting out as misaligned along the x-axis (e.g., in the first direction) in a bonding operation to bond the substrate 210 with the substrate 220. However, as the substrate 210 and the substrate 220 are heated in the bonding operation (which causes the substrate 210 and the substrate 220 to expand), the combination of the increased widths of the scribe lines 216 and the greater expansion rate of the substrate 220 results in the semiconductor devices 212 and the semiconductor devices 222 moving into approximate alignment along the x-axis.

To further promote alignment between the semiconductor devices 212 and the semiconductor devices 222, the scribe lines 216 may progressively increase in width from near a center of the substrate 210 toward the edge (or outer perimeter) of the substrate 210. The progressive increase in width may compensate for the increasing expansion rate from near a center of the substrate 220 to an edge of the substrate 220, which may result in greater displacement of semiconductor devices 222 near the edge of the substrate 220 relative to semiconductor devices 222 near the center of the substrate 220 during bonding. Accordingly, the widths of the scribe lines 216 may increase toward the edge of the substrate 210 such that the spacing between the semiconductor devices 212 increases toward the edge of the substrate 210 to compensate for the greater displacement of the semiconductor devices 222 near the edge of the substrate 220 during bonding. In this way, the substrate 210 may include a plurality of subsets of the scribe lines 216, where each subset has a different width relative to other subsets of the scribe lines 216.

As an example, the scribe lines 216 may include a first subset 216a of one or more scribe lines and a second subset 216b of one or more scribe lines. The first subset 216a may be located closer to the center of the substrate 210 relative to the second subset 216b. The width (w2) of the second subset 216b of the scribe lines 216 may be greater relative to the width (w3) of the first subset 216a of the scribe lines 216. In some implementations, the widths of the scribe lines 216 may progressively increase in a range of approximately 1 micron to approximately 4 microns from scribe line to scribe line starting near the center of the substrate 210 increasing toward the edge of the substrate 210. As an example, if the width (w1) of the scribe lines 214, 224, and 226 are approximately 80 microns, the width (w3) of the first subset 216a may be in a range of approximately 81 microns to approximately 84 microns, the width (w2) of the second subset 216b may be in a range of approximately 82 microns to approximately 88 microns, and so on. In some implementations, the scribe lines 216 include a greater quantity of subsets of progressively increasing widths from near the center of the substrate 210 to near the edge of the substrate 210.

FIGS. 2B and 2C illustrate cross-sectional elevation views (along the x-axis of FIG. 2A) of a bonding operation to bond the substrate 210 and the substrate 220. The bonding operation may be performed in connection with the bonding tool 110. As shown in FIG. 2B, the substrate 210 and the substrate 220 may be arranged such that the semiconductor devices 212 are facing the semiconductor devices 222. The substrate 210 and the substrate 220 may be pre-bonded by placing the semiconductor devices 212 on and/or against the semiconductor devices 222 (or vice-versa). As further shown in FIG. 2B, at least a subset of the semiconductor devices 212 and at least a subset of the semiconductor devices 222 do not align at the pre-bonding stage. This is due to the widths of the scribe lines 216 (e.g., the subset 216a and the subset 216b) being greater relative to the widths of the scribe lines 226. Moreover, the magnitude or amount of misalignment may increase from near the centers of the substrate 210 and the substrate 220 to near the edges of the substrate 210 and the substrate 220 due to the progressively increasing widths of the subset 216a and the subset 216b.

As shown in FIG. 2C, the semiconductor devices 212 and the semiconductor devices 222 may be approximately aligned after the bonding operation. As explained above, the different expansion rates of the substrate 210 and the substrate 220 may result in a greater amount of lateral displacement of the semiconductor devices 222 (e.g., along the x-axis in FIG. 2A) relative to the semiconductor devices 212. The progressive increase in widths of the scribe lines 216 (e.g., the subset 216a and the subset 216b) may compensate for the greater amount of lateral displacement of the semiconductor devices 222 in that the lateral displacement of the semiconductor devices 222 may bring the semiconductor devices 222 into alignment with the semiconductor devices 212, as shown in FIG. 2C.

A semiconductor device 212 and a semiconductor device 222 may be determined to be approximately aligned after bonding based on alignment in one or more directions and/or along one or more axes. For example, the alignment of a semiconductor device 212 and a semiconductor device 222 may be analyzed for alignment along the x-axis (which may also be referred to left/right alignment) and/or alignment along the y-axis (which may also be referred to as top/bottom alignment). In some implementations, the x-axis is defined as a vector that extends from a first edge of a substrate to a second edge of the substrate across the widest point on the substrate starting from an alignment mark on the substrate such as a wafer notch. In some implementations, the y-axis is approximately perpendicular to the x-axis and is defined as a vector that extends from a first edge of a substrate to a second edge of the substrate across the widest point on the substrate.

In some implementations, a device (e.g., the bonding tool 110, a processing device 1002 described in connection with FIGS. 10A-10D, and/or another device) generates alignment data and determines whether a semiconductor device 212 and a semiconductor device 222 are approximately aligned based on the alignment data. Alignment data may include misalignment indexes (e.g., for the x-axis and the y-axis) based on overlay test patterns of the substrate 210 and the substrate 220. The alignment index may represent a percentage of non-overlapping area of the semiconductor device 212 and the semiconductor device 222 (e.g., the surface area of the semiconductor device 212 that does not overlap with the surface area of the semiconductor device 222 or vice-versa) or a ratio between the non-overlapping area and the total surface area of the semiconductor device 212 and the semiconductor device 222.

In some implementations, the device may determine the semiconductor device 212 and the semiconductor device 222 to be approximately aligned based on the percentage of non-overlapping area of the semiconductor device 212 and the semiconductor device 222 being equal to or less than approximately 0.005%. In some implementations, the device may determine the semiconductor device 212 and the semiconductor device 222 to be approximately aligned based on the percentage of non-overlapping area of the semiconductor device 212 and the semiconductor device 222 being equal to or less than approximately 0.002%. The techniques described herein may enable a reduction in misalignment between semiconductor devices that are bonded together by approximately 60% or greater.

As indicated above, FIGS. 2A-2C are provided as an example. Other examples may differ from what is described with regard to FIGS. 2A-2C.

Figure 3:
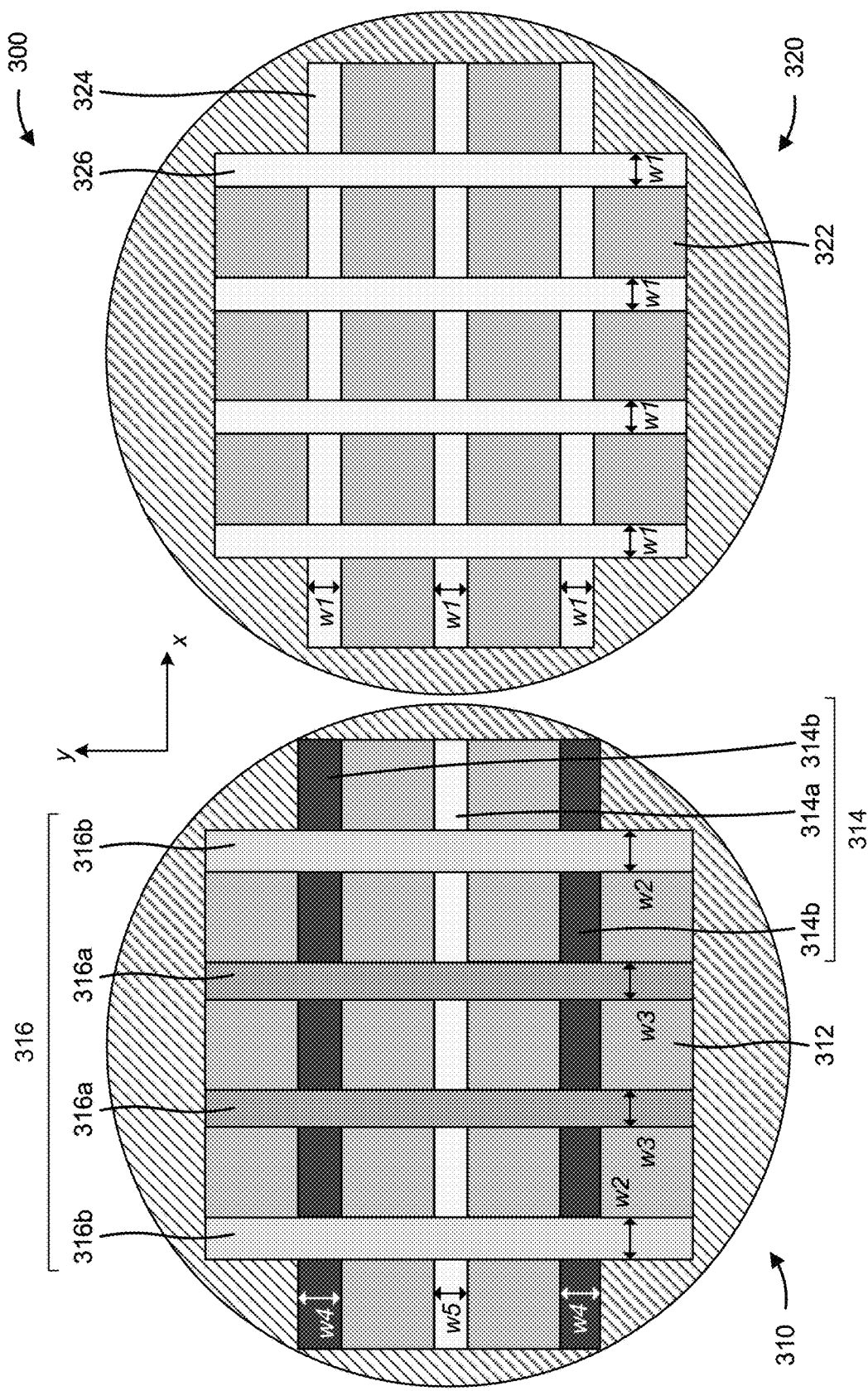

FIG. 3 is a diagram of an example implementation 300 described herein. The example implementation 300 may be similar to the example implementation 200 in that the example implementation 300 includes progressively sized scribe lines on a single substrate of two substrates that are to be bonded. In addition, the example implementation 300 includes a plurality of sets of progressively sized scribe lines in a plurality of directions on a single substrate to compensate for thermal expansion of the substrate in a plurality of directions. In this way, the plurality of sets of progressively sized scribe lines may be used to compensate for actinomorphic thermal expansion to achieve approximate alignment of semiconductor devices on the two substrates in a plurality of directions.

As shown in FIG. 3, the example implementation 300 may include a substrate 310 and a substrate 320 that are to be bonded. The substrate 310 and the substrate 320 may be bonded using one or more of the bonding techniques described herein, such as eutectic bonding, fusion (or direct) bonding, hybrid bonding, or another type of semiconductor substrate bonding technique. The substrate 310 may include a plurality of semiconductor devices 312, and the substrate 320 may include a plurality of semiconductor devices 322. The semiconductor devices 312 and 322 may be formed by one or more semiconductor processing techniques described herein. Respective pairs of the semiconductor devices 312 and 322 may be formed into three-dimensional semiconductor devices that include transistors, memory devices, MEMS, ASICs, SoCs, and/or other types of semiconductor devices by bonding the substrate 310 and the substrate 320.

The semiconductor devices 312 may be arranged in a grid on the substrate 310 such that a plurality of scribe lines 314 separate rows (or columns) of the semiconductor devices 312, and a plurality of scribe lines 316 separate columns (or rows) of the semiconductor devices 312. The scribe lines 314 may be formed in a first direction (e.g., along the x-axis shown in FIG. 3) in the substrate 310, and the scribe lines 316 may be formed in a second (e.g., perpendicular) direction (e.g., along the y-axis shown in FIG. 3) in the substrate 310 such that the scribe lines 314 and the scribe lines 316 intersect at various locations across the substrate 310. Similarly, the semiconductor devices 322 may be arranged in a grid on the substrate 320 such that a plurality of scribe lines 324 separate rows (or columns) of the semiconductor devices 322, and a plurality of scribe lines 326 separate columns (or rows) of the semiconductor devices 322. The scribe lines 324 may be formed in a first direction (e.g., along the x-axis shown in FIG. 3) in the substrate 320, and the scribe lines 326 may be formed in a second (e.g., perpendicular) direction (e.g., along the y-axis shown in FIG. 3) in the substrate 320 such that the scribe lines 324 and the scribe lines 326 intersect at various locations across the substrate 320.

As further shown in FIG. 3, each of the scribe lines 314, 316, 324, and 326 may have a particular width along a short dimension of the scribe lines 314, 316, 324, and 326. The scribe lines 324 and 326 may both have a similar width (w1), which may be in a range of approximately 60 microns to approximately 80 microns or in a range of approximately 30 microns to approximately 100 microns, among other examples.

The substrate 310 and the substrate 320 may experience actinomorphic thermal expansion during a bonding operation due to thermal expansion of the substrate 310 and the substrate 320. As a result, the size of each of the substrate 310 and the substrate 320 may increase in a radially symmetric manner such that the respective diameters of the substrate 310 and the substrate 320 may increase along the x-axis and along the y-axis illustrated in FIG. 3. Moreover, the substrate 310 may be referred to as a low expansion wafer and the substrate 320 may be referred to as a high expansion wafer in that the substrate 320 may have an expansion rate that is greater relative to the expansion rate of the substrate 310. To compensate for the greater actinomorphic thermal expansion of the substrate 320, the scribe lines 314 and the scribe lines 316 may have widths that are greater relative to the width (w1) of the scribe lines 324 and 326.

The increased widths of the scribe lines 316 relative to the scribe lines 326 may result in the semiconductor devices 312 and the semiconductor devices 322 starting out as misaligned along the x-axis (e.g., in the first direction) in a bonding operation to bond the substrate 310 with the substrate 320. However, as the substrate 310 and the substrate 320 are heated in the bonding operation (which causes the substrate 310 and the substrate 320 to expand), the combination of the increased widths of the scribe lines 316 and the greater expansion rate of the substrate 320 results in the semiconductor devices 312 and the semiconductor devices 322 moving into approximate alignment along the x-axis.

Similarly, the increased widths of the scribe lines 314 relative to the scribe lines 324 may result in the semiconductor devices 312 and the semiconductor devices 322 starting out as misaligned along the y-axis (e.g., in the second direction) in a bonding operation to bond the substrate 310 with the substrate 320. However, as the substrate 310 and the substrate 320 are heated in the bonding operation (which causes the substrate 310 and the substrate 320 to expand), the combination of the increased widths of the scribe lines 314 and the greater expansion rate of the substrate 320 results in the semiconductor devices 312 and the semiconductor devices 322 moving into approximate alignment along the y-axis.

To further promote alignment between the semiconductor devices 312 and the semiconductor devices 322 along the x-axis (e.g., in the first direction), the scribe lines 316 may progressively increase in width from near a center of the substrate 310 toward the edge (or outer perimeter) of the substrate 310. The progressive increase in width may compensate for the increasing expansion rate from near a center of the substrate 320 to an edge of the substrate 320 along the x-axis (e.g., in the first direction), which may result in greater displacement of semiconductor devices 322 near the edge of the substrate 320 relative to semiconductor devices 322 near the center of the substrate 320 during bonding. Accordingly, the widths of the scribe lines 316 may increase toward the edge of the substrate 310 such that the spacing between the semiconductor devices 312 increases toward the edge of the substrate 310 to compensate for the greater displacement of the semiconductor devices 322 near the edge of the substrate 320 during bonding. In this way, substrate 310 may include a plurality of subsets of the scribe lines 316, where each subset has a different width relative to other subsets of the scribe lines 316.

As an example, the scribe lines 316 may include a first subset 316a of one or more scribe lines and a second subset 316b of one or more scribe lines. The first subset 316a may be located closer to the center of the substrate 310 relative to the second subset 316b. The width (w2) of the second subset 316b of the scribe lines 316 may be greater relative to the width (w3) of the first subset 316a of the scribe lines 316. In some implementations, the widths of the scribe lines 316 may progressively increase in a range of approximately 1 micron to approximately 4 microns from scribe line to scribe line starting near the center of the substrate 310 and increasing toward the edge of the substrate 310. As an example, if the width (w1) of the scribe lines 324 and 326 are approximately 60 microns, the width (w3) of the first subset 316a may be in a range of approximately 61 microns to approximately 64 microns, the width (w2) of the second subset 316b may be in a range of approximately 62 microns to approximately 68 microns, and so on. In some implementations, the scribe lines 316 include a greater quantity of subsets of progressively increasing widths from near the center of the substrate 310 to near the edge of the substrate 310.

To further promote alignment between the semiconductor devices 312 and the semiconductor devices 322 along the y-axis (e.g., in the second direction), the scribe lines 314 may progressively increase in width from near a center of the substrate 310 toward the edge (or outer perimeter) of the substrate 310. The progressive increase in width may compensate for the increasing expansion rate from near a center of the substrate 320 to an edge of the substrate 320 along the y-axis (e.g., in the second direction), which may result in greater displacement of semiconductor devices 322 near the edge of the substrate 320 relative to semiconductor devices 322 near the center of the substrate 320 during bonding. Accordingly, the widths of the scribe lines 314 may increase toward the edge of the substrate 310 such that the spacing between the semiconductor devices 312 increases toward the edge of the substrate 310 to compensate for the greater displacement of the semiconductor devices 322 near the edge of the substrate 320 during bonding. In this way, the substrate 310 may include a plurality of subsets of the scribe lines 314, where each subset has a different width relative to other subsets of the scribe lines 314.

As an example, the scribe lines 314 may include a first subset 314a of one or more scribe lines and a second subset 314b of one or more scribe lines. The first subset 314a may be located closer to the center of the substrate 310 relative to the second subset 314b. The width (w4) of the second subset 314b of the scribe lines 314 may be greater relative to the width (w5) of the first subset 314a of the scribe lines 314. In some implementations, the widths of the scribe lines 314 may progressively increase in a range of approximately 1 micron to approximately 4 microns from scribe line to scribe line starting from near the center of the substrate 310 and increasing to near the edge of the substrate 310. As an example, if the width (w1) of the scribe lines 324 and 326 are approximately 70 microns, the width (w5) of the first subset 314a may be in a range of approximately 71 microns to approximately 74 microns, the width (w4) of the second subset 314b may be in a range of approximately 72 microns to approximately 78 microns, and so on. In some implementations, the scribe lines 314 include a greater quantity of subsets of progressively increasing widths from near the center of the substrate 310 toward the edge of the substrate 310.

As indicated above, the scribe lines 314 and 316 may progressively increase in width from near the center of the substrate 310 to near the edge of the substrate 310 to compensate for actinomorphic thermal expansion of the substrate 320. Accordingly, the increases in the widths of the scribe lines 314 and 316 may be approximately equal to compensate for the radially symmetric thermal expansion of the substrate 320. In some implementations, the increases in the widths of the scribe lines 314 and 316 may be different to compensate for asymmetric thermal expansion of the substrate 310, such as in cases where different types of devices are formed along the x-axis and along the y-axis of the substrate 320 (which may result in asymmetric thermal expansion rates along the x-axis and the y-axis of the substrate 320).

As indicated above, FIG. 3 is provided as an example. Other examples may differ from what is described with regard to FIG. 3.

Figure 4:
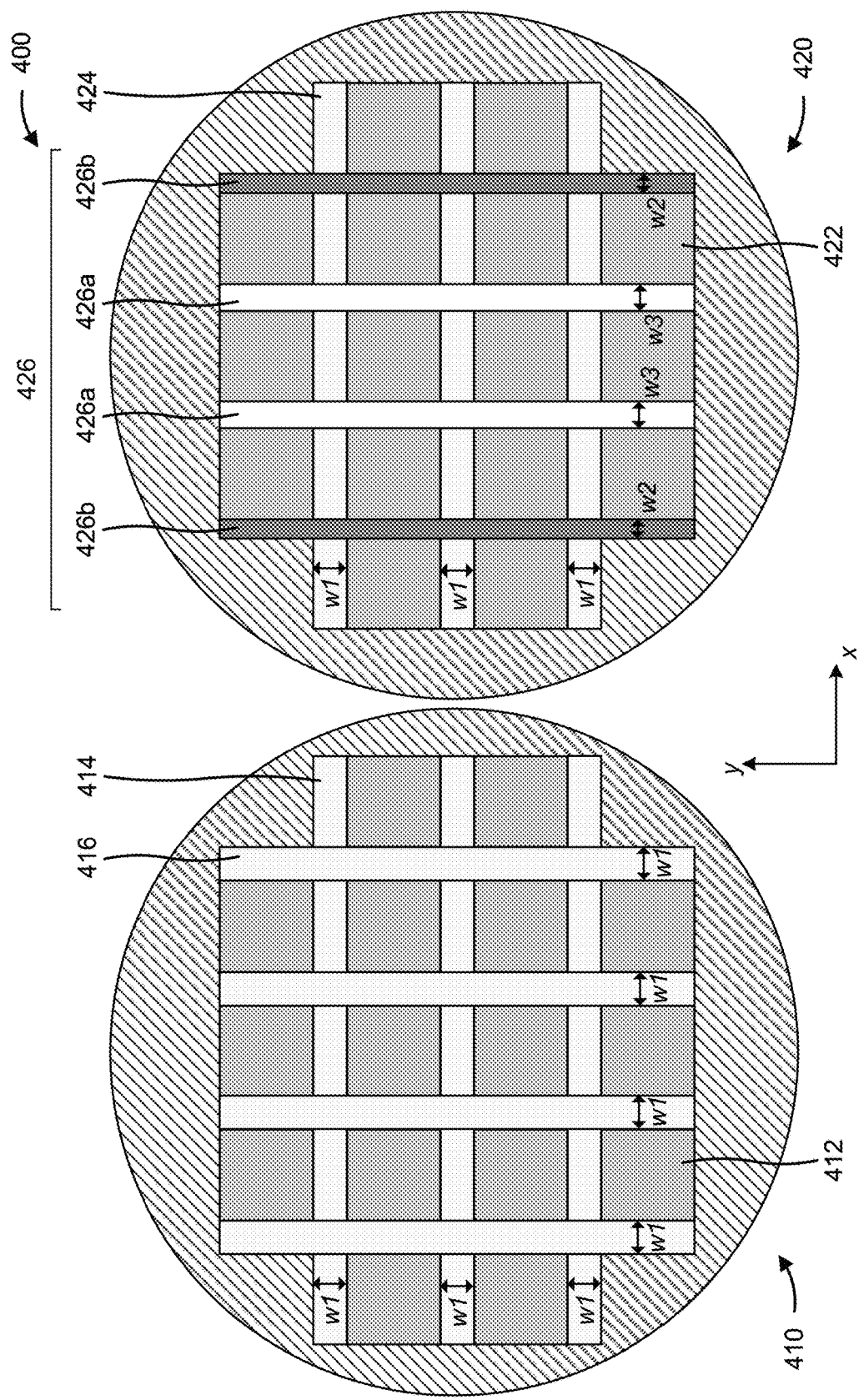

FIG. 4 is a diagram of an example implementation 400 described herein. The example implementation 400 may include an example of progressively sized scribe lines that are included on a single substrate of two substrates that are to be bonded. Moreover, the progressively sized scribe lines may be included in a single direction in the substrate to compensate for thermal expansion of the substrate in the single direction. The example implementation 400 may be different from the example implementation 200 in that progressively sized scribe lines decrease in width from a center of a high expansion rate substrate that is to be bonded with a low expansion rate substrate toward an edge of the high expansion rate substrate. In this way, the progressively sized scribe lines of decreasing width facilitate alignment of semiconductor devices on substrates that are to be bonded together while the decreased scribe line sizes may enable an increased semiconductor device density on the substrates.

FIG. 4 illustrates a top-down view (or plan view) of a substrate 410 and a substrate 420 that are to be bonded. The substrate 410 and the substrate 420 may be bonded using one or more of the bonding techniques described herein, such as eutectic bonding, fusion (or direct) bonding, hybrid bonding, or another type of semiconductor substrate bonding technique. The substrate 410 and the substrate 420 may each include a semiconductor wafer, a semiconductor substrate, or another type of substrate in and/or on which semiconductor devices may be formed.

As shown in FIG. 4, the substrate 410 may include a plurality of semiconductor devices 412, and the substrate 420 may include a plurality of semiconductor devices 422. The semiconductor devices 412 may be arranged in a grid on the substrate 410 such that a plurality of scribe lines 414 separate rows (or columns) of the semiconductor devices 412, and a plurality of scribe lines 416 separate columns (or rows) of the semiconductor devices 412. The scribe lines 414 may be formed in a first direction (e.g., along the x-axis shown in FIG. 4) in the substrate 410, and the scribe lines 416 may be formed in a second (e.g., perpendicular) direction (e.g., along the y-axis shown in FIG. 4) in the substrate 410 such that the scribe lines 414 and the scribe lines 416 intersect at various locations across the substrate 410. Similarly, the semiconductor devices 422 may be arranged in a grid on the substrate 420 such that a plurality of scribe lines 424 separate rows (or columns) of the semiconductor devices 422, and a plurality of scribe lines 426 separate columns (or rows) of the semiconductor devices 422. The scribe lines 424 may be formed in a first direction (e.g., along the x-axis shown in FIG. 4) in the substrate 420, and the scribe lines 426 may be formed in a second (e.g., perpendicular) direction (e.g., along the y-axis shown in FIG. 4) in the substrate 420 such that the scribe lines 424 and the scribe lines 426 intersect at various locations across the substrate 420.

As further shown in FIG. 4, each of the scribe lines 414, 416, 424, and 426 may have a particular width along a short dimension of the scribe lines 414, 416, 424, and 426. The scribe lines 414, 416, and 424 may all have a similar width (w1), which may be in a range of approximately 60 microns to approximately 80 microns or in a range of approximately 30 microns to approximately 100 microns, among other examples.

The substrate 410 may be referred to as a low expansion wafer and the substrate 420 may be referred to as a high expansion wafer in that the substrate 420 may have an expansion rate that is greater relative to the expansion rate of the substrate 410. Thus, the substrate 420 may expand in size (e.g., in diameter) a greater amount relative to the substrate 410. In the example implementation 400, the scribe lines 426 may have widths that are lesser relative to the width (w1) of the scribe lines 414, 416, and 424 to compensate for the greater thermal expansion of the substrate 420 relative to the thermal expansion of the substrate 410. The decreased widths of the scribe lines 426 relative to the scribe lines 416 may result in the semiconductor devices 412 and the semiconductor devices 422 starting out as misaligned along the x-axis (e.g., in the first direction) in a bonding operation to bond the substrate 410 with the substrate 420. However, as the substrate 410 and the substrate 420 are heated in the bonding operation (which causes the substrate 410 and the substrate 420 to expand), the combination of the reduced widths of the scribe lines 426 and the greater expansion rate of the substrate 420 results in the semiconductor devices 412 and the semiconductor devices 422 moving into approximate alignment along the x-axis.

To further promote alignment between the semiconductor devices 412 and the semiconductor devices 422, the scribe lines 426 may progressively decrease in width from near a center of the substrate 420 toward the edge (or outer perimeter) of the substrate 420. The progressive decrease in width may compensate for the increasing expansion rate from near a center of the substrate 420 toward an edge of the substrate 420. The increasing expansion may result in greater displacement of semiconductor devices 422 near the edge of the substrate 420 relative to semiconductor devices 422 near the center of the substrate 420 during bonding. Accordingly, the widths of the scribe lines 426 may decrease toward the edge of the substrate 420 such that the spacing between the semiconductor devices 422 decreases toward the edge of the substrate 420 to compensate for the greater displacement of the semiconductor devices 422 near the edge of the substrate 420 during bonding. In this way, the substrate 420 may include a plurality of subsets of the scribe lines 426, where each subset has a different width relative to other subsets of the scribe lines 426.

As an example, the scribe lines 426 may include a first subset 426a of one or more scribe lines and a second subset 426b of one or more scribe lines. The first subset 426a may be located closer to the center of the substrate 420 relative to the second subset 426b. The width (w2) of the second subset 426b of the scribe lines 426 may be lesser relative to the width (w3) of the first subset 426a of the scribe lines 426. In some implementations, the widths of the scribe lines 426 may progressively decrease in a range of approximately 1 micron to approximately 4 microns from scribe line to scribe line starting near the center of the substrate 420 and decreasing toward the edge of the substrate 420. As an example, if the width (w1) of the scribe lines 414, 416, and 424 are approximately 90 microns, the width (w3) of the first subset 426a may be in a range of approximately 86 microns to approximately 89 microns, the width (w2) of the second subset 426b may be in a range of approximately 82 microns to approximately 88 microns, and so on. In some implementations, the scribe lines 426 include a greater quantity of subsets of progressively decreasing widths from near the center of the substrate 420 to near the edge of the substrate 420.

As indicated above, FIG. 4 is provided as an example. Other examples may differ from what is described with regard to FIG. 4.

Figure 5:
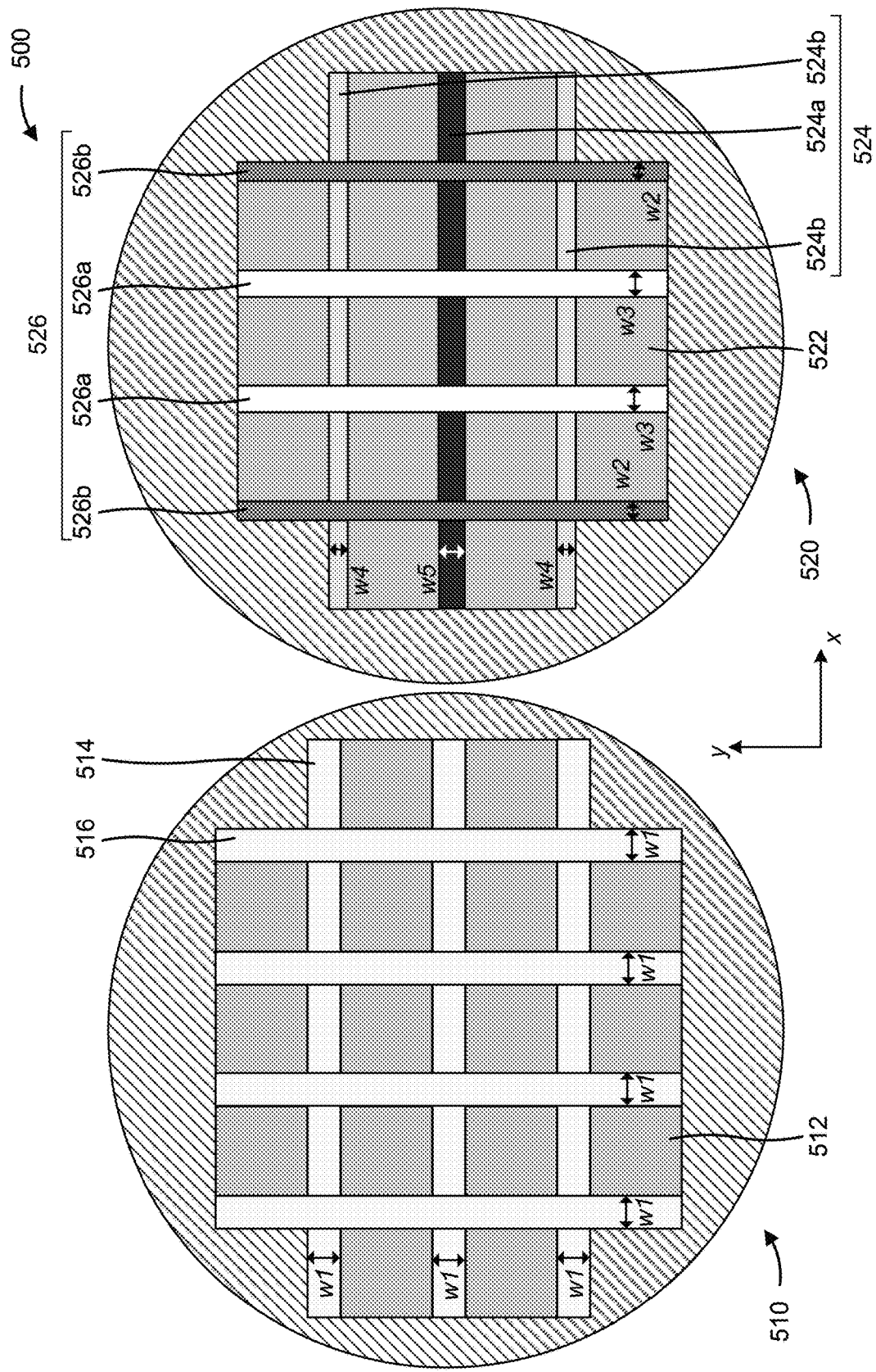

FIG. 5 is a diagram of an example implementation 500 described herein. The example implementation 500 may be similar to the example implementation 400 in that the example implementation 500 includes scribe lines of progressively decreasing widths on a single substrate of two substrates that are to be bonded. In addition, the example implementation 500 includes a plurality of sets of scribe lines of progressively decreasing widths in a plurality of directions on a single substrate to compensate for thermal expansion in a plurality of directions. In this way, the plurality of sets of scribe lines of progressively decreasing widths may be used to compensate for actinomorphic thermal expansion to achieve approximate alignment of semiconductor devices on the two substrates in a plurality of directions.

As shown in FIG. 5, the example implementation 500 may include a substrate 510 and a substrate 520 that are to be bonded. The substrate 510 and the substrate 520 may be bonded using one or more of the bonding techniques described herein, such as eutectic bonding, fusion (or direct) bonding, hybrid bonding, or another type of semiconductor substrate bonding technique. The substrate 510 may include a plurality of semiconductor devices 512, and the substrate 520 may include a plurality of semiconductor devices 522. The semiconductor devices 512 and 520 may be formed by one or more semiconductor processing techniques described herein. Respective pairs of the semiconductor devices 512 and 522 may be formed into three-dimensional semiconductor devices that include transistors, memory devices, MEMS, ASICs, SoCs, and/or other types of semiconductor devices by bonding the substrate 510 and the substrate 520.

The semiconductor devices 512 may be arranged in a grid on the substrate 510 such that a plurality of scribe lines 514 separate rows (or columns) of the semiconductor devices 512, and a plurality of scribe lines 516 separate columns (or rows) of the semiconductor devices 512. The scribe lines 514 may be formed in a first direction (e.g., along the x-axis shown in FIG. 5) in the substrate 510, and the scribe lines 516 may be formed in a second (e.g., perpendicular) direction (e.g., along the y-axis shown in FIG. 5) in the substrate 510 such that the scribe lines 514 and the scribe lines 516 intersect at various locations across the substrate 510. Similarly, the semiconductor devices 522 may be arranged in a grid on the substrate 520 such that a plurality of scribe lines 524 separate rows (or columns) of the semiconductor devices 522, and a plurality of scribe lines 526 separate columns (or rows) of the semiconductor devices 522. The scribe lines 524 may be formed in a first direction (e.g., along the x-axis shown in FIG. 5) in the substrate 520, and the scribe lines 526 may be formed in a second (e.g., perpendicular) direction (e.g., along the y-axis shown in FIG. 5) in the substrate 520 such that the scribe lines 524 and the scribe lines 526 intersect at various locations across the substrate 520.

As further shown in FIG. 5, each of the scribe lines 514, 516, 524, and 526 may have a particular width along a short dimension of the scribe lines 514, 516, 524, and 526. The scribe lines 514 and 516 may both have a similar width (w1), which may be in a range of approximately 60 microns to approximately 80 microns or in a range of approximately 30 microns to approximately 100 microns, among other examples.

The substrate 510 and the substrate 520 may experience actinomorphic thermal expansion during a bonding operation due to thermal expansion of the substrate 510 and the substrate 520. As a result, the size of each of the substrate 510 and the substrate 520 may increase in a radially symmetric manner such that the respective diameters of the substrate 510 and the substrate 520 may increase along the x-axis and along the y-axis illustrated in FIG. 5. Moreover, the substrate 510 may be referred to as a low expansion wafer and the substrate 520 may be referred to as a high expansion wafer in that the substrate 520 may have an expansion rate that is greater relative to the expansion rate of the substrate 510. To compensate for the greater actinomorphic thermal expansion of the substrate 520, the scribe lines 524 and the scribe lines 526 may have widths that are lesser relative to the width (w1) of the scribe lines 514 and 516.

The decreased widths of the scribe lines 526 relative to the scribe lines 516 may result in the semiconductor devices 512 and the semiconductor devices 522 starting out as misaligned along the x-axis (e.g., in the first direction) in a bonding operation to bond the substrate 510 with the substrate 520. However, as the substrate 510 and the substrate 520 are heated in the bonding operation (which causes the substrate 510 and the substrate 520 to expand), the combination of the decreased widths of the scribe lines 526 and the greater expansion rate of the substrate 520 results in the semiconductor devices 512 and the semiconductor devices 522 moving into approximate alignment along the x-axis.

Similarly, the decreased widths of the scribe lines 524 relative to the scribe lines 514 may result in the semiconductor devices 512 and the semiconductor devices 522 starting out as misaligned along the y-axis (e.g., in the second direction) in a bonding operation to bond the substrate 510 with the substrate 520. However, as the substrate 510 and the substrate 520 are heated in the bonding operation (which causes the substrate 510 and the substrate 520 to expand), the combination of the decreased widths of the scribe lines 524 and the greater expansion rate of the substrate 520 results in the semiconductor devices 512 and the semiconductor devices 522 moving into approximate alignment along the y-axis.

To further promote alignment between the semiconductor devices 512 and the semiconductor devices 522 along the x-axis (e.g., in the first direction), the scribe lines 526 may progressively decrease in width from near a center of the substrate 520 toward the edge (or outer perimeter) of the substrate 520. The progressive decrease in width may compensate for the increasing expansion rate from near a center of the substrate 520 toward an edge of the 520 along the x-axis (e.g., in the first direction), which may result in greater displacement of semiconductor devices 522 near the edge of the substrate 520 relative to semiconductor devices 522 near the center of the substrate 520 during bonding. Accordingly, the widths of the scribe lines 526 may decrease toward the edge of the substrate 520 such that the spacing between the semiconductor devices 522 decreases toward the edge of the substrate 520 to compensate for the greater displacement of the semiconductor devices 522 near the edge of the substrate 520 during bonding. In this way, the substrate 520 may include a plurality of subsets of the scribe lines 526, where each subset has a different width relative to other subsets of the scribe lines 526.

As an example, the scribe lines 526 may include a first subset 526a of one or more scribe lines and a second subset 526b of one or more scribe lines. The first subset 526a may be located closer to the center of the substrate 520 relative to the second subset 526b. The width (w2) of the second subset 526b of the scribe lines 526 may be lesser relative to the width (w3) of the first subset 526a of the scribe lines 526. In some implementations, the widths of the scribe lines 526 may progressively decrease in a range of approximately 1 micron to approximately 4 microns from scribe line to scribe line starting near the center of the substrate 520 and decreasing toward the edge of the substrate 520. As an example, if the width (w1) of the scribe lines 514 and 516 are approximately 100 microns, the width (w3) of the first subset 526a may be in a range of approximately 96 microns to approximately 99 microns, the width (w2) of the second subset 526b may be in a range of approximately 92 microns to approximately 98 microns, and so on. In some implementations, the scribe lines 526 include a greater quantity of subsets of progressively decreasing widths from near the center of the substrate 520 toward the edge of the substrate 520.

To further promote alignment between the semiconductor devices 512 and the semiconductor devices 522 along the y-axis (e.g., in the second direction), the scribe lines 524 may progressively decrease in width from near a center of the substrate 520 toward the edge (or outer perimeter) of the substrate 520. The progressive decrease in width may compensate for the increasing expansion rate from near a center of the substrate 520 toward an edge of the substrate 520 along the y-axis (e.g., in the second direction), which may result in greater displacement of semiconductor devices 522 near the edge of the substrate 520 relative to semiconductor devices 522 near the center of the substrate 520 during bonding. Accordingly, the widths of the scribe lines 524 may decrease toward the edge of the substrate 520 such that the spacing between the semiconductor devices 522 decreases toward the edge of the substrate 520 along the y-axis (e.g., in the second direction) to compensate for the greater displacement of the semiconductor devices 522 near the edge of the substrate 520 during bonding. In this way, the substrate 520 may include a plurality of subsets of the scribe lines 524, where each subset has a different width relative to other subsets of the scribe lines 524.

As an example, the scribe lines 524 may include a first subset 524a of one or more scribe lines and a second subset 524b of one or more scribe lines. The first subset 524a may be located closer to the center of the substrate 520 relative to the second subset 524b. The width (w4) of the second subset 524b of the scribe lines 524 may be lesser relative to the width (w5) of the first subset 524a of the scribe lines 524. In some implementations, the widths of the scribe lines 524 may progressively decrease in a range of approximately 1 micron to approximately 4 microns from scribe line to scribe line starting from near the center of the substrate 520 and decreasing toward the edge of the substrate 520. As an example, if the width (w1) of the scribe lines 514 and 516 are approximately 100 microns, the width (w5) of the first subset 524a may be in a range of approximately 96 microns to approximately 99 microns, the width (w4) of the second subset 524b may be in a range of approximately 92 microns to approximately 98 microns, and so on. In some implementations, the scribe lines 524 include a greater quantity of subsets of progressively decreasing widths from near the center of the substrate 520 to near the edge of the substrate 520.

As indicated above, the scribe lines 524 and 526 may progressively decrease in width from near the center of the substrate 520 to near the edge of the substrate 520 to compensate for actinomorphic thermal expansion of the substrate 520. Accordingly, the decreases in the widths of the scribe lines 524 and 526 may be approximately equal to compensate for the radially symmetric thermal expansion of the substrate 520. In some implementations, the decreases in the widths of the scribe lines 524 and 526 may be different to compensate for asymmetric thermal expansion of the substrate 520, such as in cases where different types of devices are formed along the x-axis and along the y-axis of the substrate 520 (which may result in asymmetric thermal expansion rates along the x-axis and the y-axis of the substrate 520).

As indicated above, FIG. 5 is provided as an example. Other examples may differ from what is described with regard to FIG. 5.

Figure 6:
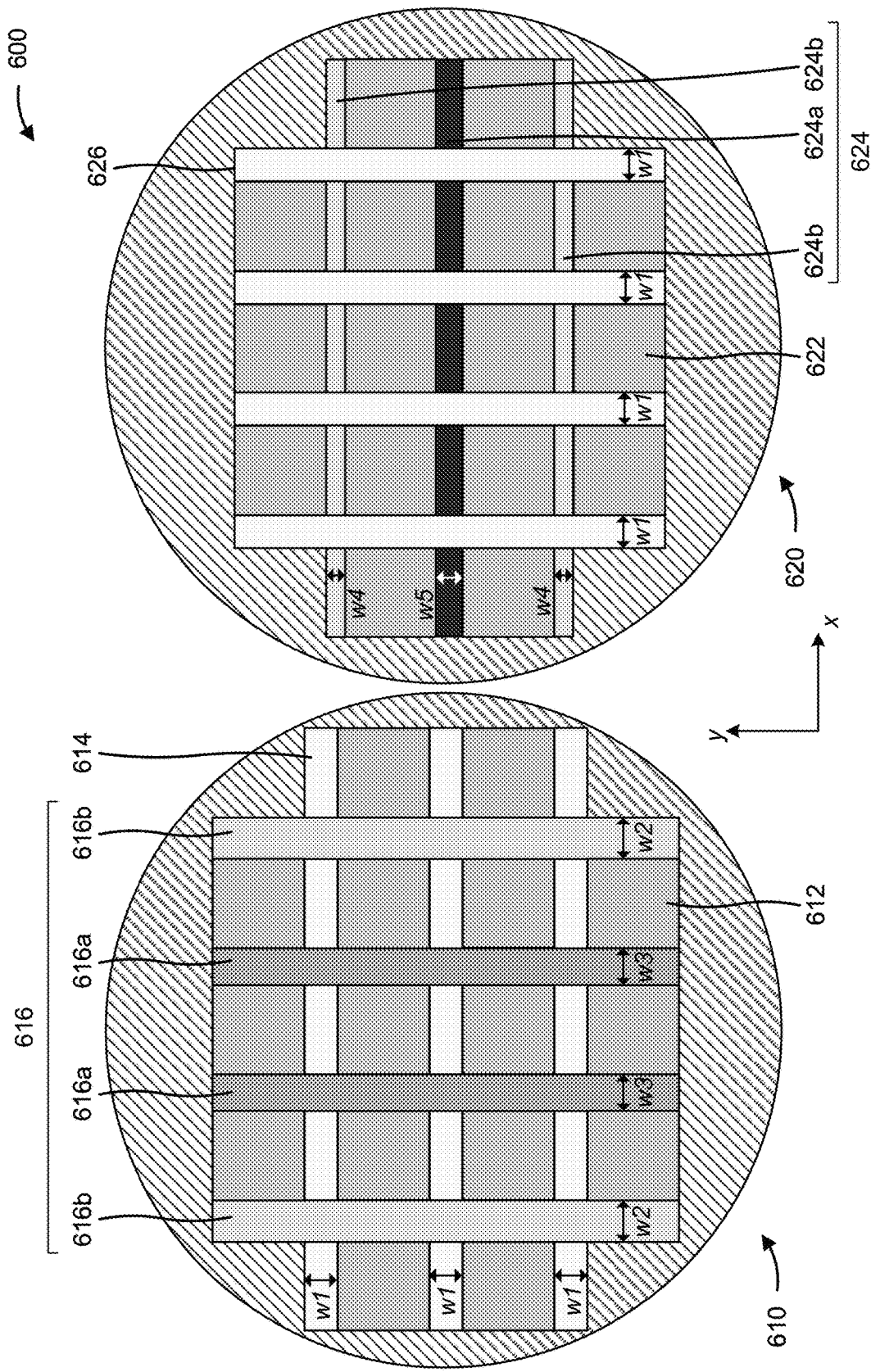

FIG. 6 is a diagram of an example implementation 600 described herein. The example implementation 600 includes an example in which a first set of scribe lines of progressively increasing widths are included on a low expansion rate substrate to compensate for thermal expansion in a first direction, and a second set of scribe lines of progressively decreasing widths are included on a high expansion rate substrate to compensate for thermal expansion in a second direction. In this way, a plurality of sets of scribe lines may be used to compensate for actinomorphic thermal expansion to achieve approximate alignment of semiconductor devices on the two substrates in a plurality of directions.

As shown in FIG. 6, the example implementation 600 may include a substrate 610 and a substrate 620 that are to be bonded. The substrate 610 and the substrate 620 may be bonded using one or more of the bonding techniques described herein, such as eutectic bonding, fusion (or direct) bonding, hybrid bonding, or another type of semiconductor substrate bonding technique. The substrate 610 may include a plurality of semiconductor devices 612, and the substrate 620 may include a plurality of semiconductor devices 622. The semiconductor devices 612 and 620 may be formed by one or more semiconductor processing techniques described herein. Respective pairs of the semiconductor devices 612 and 622 may be formed into three-dimensional semiconductor devices that include transistors, memory devices, MEMS, ASICs, SoCs, and/or other types of semiconductor devices by bonding the substrate 610 and the substrate 620.

The semiconductor devices 612 may be arranged in a grid on the substrate 610 such that a plurality of scribe lines 614 separate rows (or columns) of the semiconductor devices 612, and a plurality of scribe lines 616 separate columns (or rows) of the semiconductor devices 612. The scribe lines 614 may be formed in a first direction (e.g., along the x-axis shown in FIG. 6) in the substrate 610, and the scribe lines 616 may be formed in a second (e.g., perpendicular) direction (e.g., along the y-axis shown in FIG. 6) in the substrate 610 such that the scribe lines 614 and the scribe lines 616 intersect at various locations across the substrate 610. Similarly, the semiconductor devices 622 may be arranged in a grid on the substrate 620 such that a plurality of scribe lines 624 separate rows (or columns) of the semiconductor devices 622, and a plurality of scribe lines 626 separate columns (or rows) of the semiconductor devices 622. The scribe lines 624 may be formed in a first direction (e.g., along the x-axis shown in FIG. 6) in the substrate 620, and the scribe lines 626 may be formed in a second (e.g., perpendicular) direction (e.g., along the y-axis shown in FIG. 6) in the substrate 620 such that the scribe lines 624 and the scribe lines 626 intersect at various locations across the substrate 620.

As further shown in FIG. 6, each of the scribe lines 614, 616, 624, and 626 may have a particular width along a short dimension of the scribe lines 614, 616, 624, and 626. The scribe lines 614 and 626 may both have a similar width (w1), which may be in a range of approximately 60 microns to approximately 80 microns or in a range of approximately 30 microns to approximately 100 microns, among other examples.

The substrate 610 and the substrate 620 may experience actinomorphic thermal expansion during a bonding operation due to thermal expansion of the substrate 610 and the substrate 620. As a result, the size of each of the substrate 610 and the substrate 620 may increase in a radially symmetric manner such that the respective diameters of the substrate 610 and the substrate 620 may increase along the x-axis and along the y-axis illustrated in FIG. 6. Moreover, the substrate 610 may be referred to as a low expansion wafer and the substrate 620 may be referred to as a high expansion wafer in that the substrate 620 may have an expansion rate that is greater relative to the expansion rate of the substrate 610. To compensate for the greater actinomorphic thermal expansion of the substrate 620, the scribe lines 616 may have widths that are greater relative to the width (w1) of the scribe lines 614 and 626, and the scribe lines 624 may have widths that are lesser relative to the width (w1) of the scribe lines 614 and 626.

The greater widths of the scribe lines 616 and the lesser widths of the scribe lines 624 may result in the semiconductor devices 612 and the semiconductor devices 622 starting out as misaligned along the x-axis (e.g., in the first direction) and along the y-axis (e.g., in the second direction) in a bonding operation to bond the substrate 610 with the substrate 620. However, as the substrate 610 and the substrate 620 are heated in the bonding operation (which causes the substrate 610 and the substrate 620 to radially expand), the combination of the increased widths of the scribe lines 616 and the greater expansion rate of the substrate 620 results in the semiconductor devices 612 and the semiconductor devices 622 moving into approximate alignment along the x-axis. Moreover, the combination of the decreased widths of the scribe lines 624 and the greater expansion rate of the substrate 620 results in the semiconductor devices 612 and the semiconductor devices 622 moving into approximate alignment along the y-axis.

To further promote alignment between the semiconductor devices 612 and the semiconductor devices 622 along the x-axis (e.g., in the first direction), the scribe lines 616 may progressively increase in width from near a center of the substrate 610 toward the edge (or outer perimeter) of the substrate 610. The progressive increase in width may compensate for the increasing expansion rate from near a center of the substrate 620 toward an edge of the 620 along the x-axis (e.g., in the first direction), which may result in greater displacement of semiconductor devices 622 near the edge of the substrate 620 relative to semiconductor devices 622 near the center of the substrate 620 during bonding. Accordingly, the widths of the scribe lines 616 may increase toward the edge of the substrate 610 such that the spacing between the semiconductor devices 612 increases toward the edge of the substrate 610 to compensate for the greater displacement of the semiconductor devices 622 near the edge of the substrate 620 during bonding. In this way, the substrate 610 may include a plurality of subsets of the scribe lines 616, where each subset has a different width relative to other subsets of the scribe lines 616.

As an example, the scribe lines 616 may include a first subset 616a of one or more scribe lines and a second subset 616b of one or more scribe lines. The first subset 616a may be located closer to the center of the substrate 610 relative to the second subset 616b. The width (w2) of the second subset 616b of the scribe lines 616 may be greater relative to the width (w3) of the first subset 616a of the scribe lines 616. In some implementations, the widths of the scribe lines 616 may progressively increase in a range of approximately 1 micron to approximately 4 microns from scribe line to scribe line starting near the center of the substrate 610 and increasing toward the edge of the substrate 610. As an example, if the width (w1) of the scribe lines 614 and 626 are approximately 80 microns, the width (w3) of the first subset 526a may be in a range of approximately 81 microns to approximately 84 microns, the width (w2) of the second subset 616b may be in a range of approximately 82 microns to approximately 88 microns, and so on. In some implementations, the scribe lines 616 include a greater quantity of subsets of progressively increasing widths from near the center of the substrate 610 to near the edge of the substrate 610.

To further promote alignment between the semiconductor devices 612 and the semiconductor devices 622 along the y-axis (e.g., in the second direction), the scribe lines 624 may progressively decrease in width from near a center of the substrate 620 toward the edge (or outer perimeter) of the substrate 620. The progressive decrease in width may compensate for the increasing expansion rate from near a center of the substrate 620 to an edge of the substrate 620 along the y-axis (e.g., in the second direction), which may result in greater displacement of semiconductor devices 622 near the edge of the substrate 620 relative to semiconductor devices 622 near the center of the substrate 620 during bonding. Accordingly, the widths of the scribe lines 624 may decrease toward the edge of the substrate 620 such that the spacing between the semiconductor devices 622 decreases toward the edge of the substrate 620 along the y-axis (e.g., in the second direction) to compensate for the greater displacement of the semiconductor devices 622 near the edge of the substrate 620 during bonding. In this way, the substrate 620 may include a plurality of subsets of the scribe lines 624, where each subset has a different width relative to other subsets of the scribe lines 624.

As an example, the scribe lines 624 may include a first subset 624a of one or more scribe lines and a second subset 624b of one or more scribe lines. The first subset 624a may be located closer to the center of the substrate 620 relative to the second subset 624b. The width (w4) of the second subset 624b of the scribe lines 624 may be lesser relative to the width (w5) of the first subset 624a of the scribe lines 624. In some implementations, the widths of the scribe lines 624 may progressively decrease in a range of approximately 1 micron to approximately 4 microns from scribe line to scribe line starting from near the center of the substrate 620 and decreasing toward the edge of the substrate 620. As an example, if the width (w1) of the scribe lines 614 and 626 are approximately 80 microns, the width (w5) of the first subset 624a may be in a range of approximately 76 microns to approximately 79 microns, the width (w4) of the second subset 624b may be in a range of approximately 72 microns to approximately 78 microns, and so on. In some implementations, the scribe lines 624 include a greater quantity of subsets of progressively decreasing widths from near the center of the substrate 620 to near the edge of the substrate 620.

As indicated above, the scribe lines 616 may progressively increase in width and the scribe lines 624 may progressively decrease in width to compensate for the difference in actinomorphic thermal expansion between the substrate 610 and the substrate 620. Accordingly, the increases in the widths of the scribe lines 616 may be approximately equal to the decreases in the widths of the scribe lines 624 to compensate for the radially symmetric thermal expansion of the substrate 610 and the substrate 620. In some implementations, the increases in widths of the scribe lines 616 may be different relative to the decreases in the widths of the scribe lines 624 to compensate for asymmetric thermal expansion of the substrate 610 and/or the substrate 620, such as in cases where different types of devices are formed along the x-axis and along the y-axis of the substrate 610 and/or the substrate 620 (which may result in asymmetric thermal expansion rates along the x-axis and the y-axis of the substrate 610 and/or the substrate 620).

As indicated above, FIG. 6 is provided as an example. Other examples may differ from what is described with regard to FIG. 6.

Figure 7:
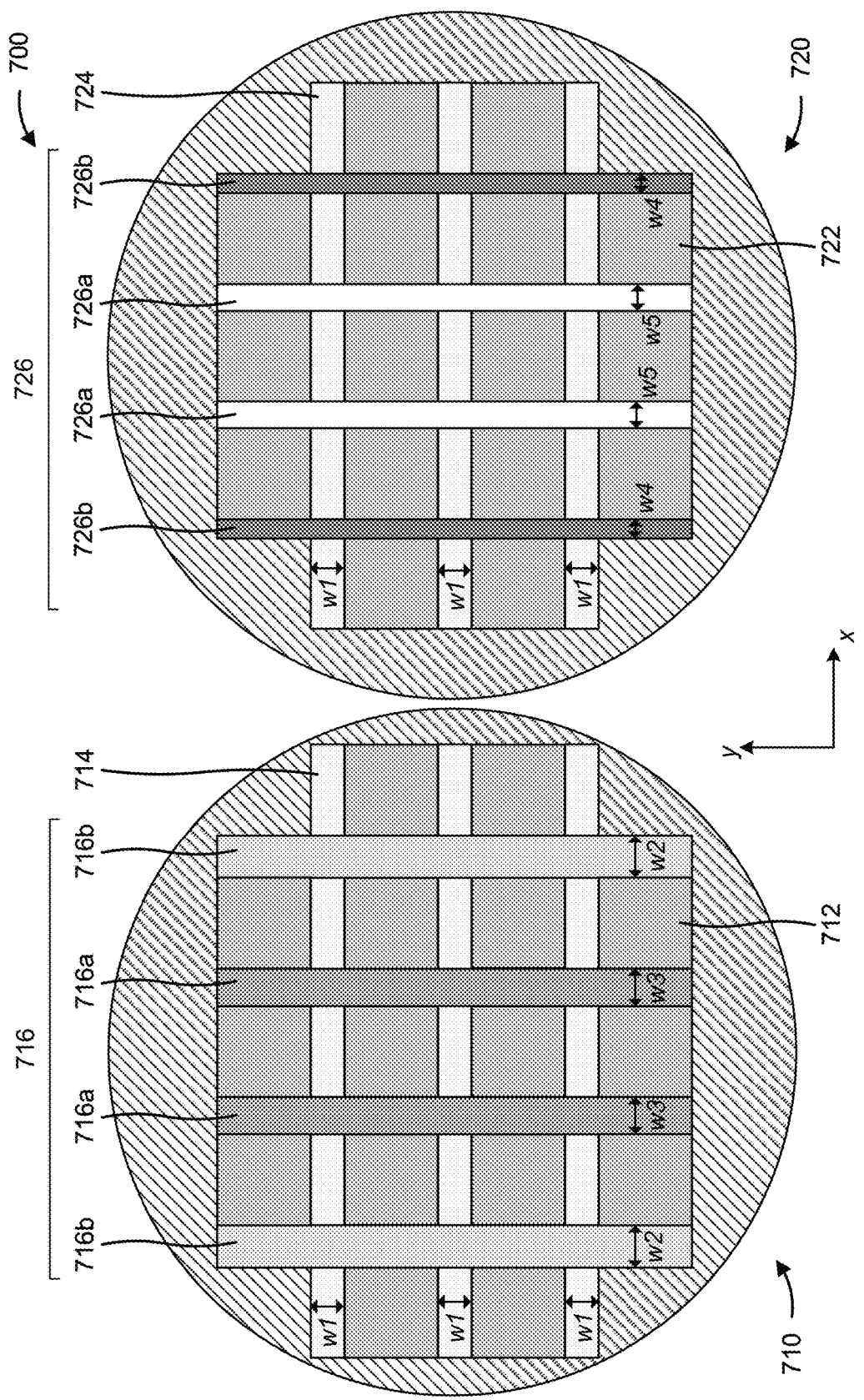

FIG. 7 is a diagram of an example implementation 700 described herein. The example implementation 700 may include an example in which scribe lines of progressively increasing widths are included on a low expansion rate substrate and scribe lines of progressively decreasing widths are included on a high expansion rate substrate. The scribe lines of progressively increasing widths and the scribe lines of progressively decreasing widths are arranged in the same direction (e.g., along the same axis) to compensate for the differences in thermal expansion of the low expansion rate substrate and the high expansion rate substrate. In this way, the scribe lines of progressively increasing widths in the low expansion rate substrate and the scribe lines of progressively decreasing widths in the high expansion rate substrate may be used to compensate for large differences in expansion rates in a single direction between the low expansion rate substrate and the high expansion rate substrate (e.g., may be used to compensate for greater differences in expansion rates relative to including only the scribe lines of progressively increasing widths or only the scribe lines of progressively decreasing widths).

As shown in FIG. 7, the example implementation 700 may include a substrate 710 and a substrate 720 that are to be bonded. The substrate 710 and the substrate 720 may be bonded using one or more of the bonding techniques described herein, such as eutectic bonding, fusion (or direct) bonding, hybrid bonding, or another type of semiconductor substrate bonding technique. The substrate 710 may include a plurality of semiconductor devices 712, and the substrate 720 may include a plurality of semiconductor devices 722. The semiconductor devices 712 and 720 may be formed by one or more semiconductor processing techniques described herein. Respective pairs of the semiconductor devices 712 and 722 may be formed into three-dimensional semiconductor devices that include transistors, memory devices, MEMS, ASICs, SoCs, and/or other types of semiconductor devices by bonding the substrate 710 and the substrate 720.

The semiconductor devices 712 may be arranged in a grid on the substrate 710 such that a plurality of scribe lines 714 separate rows (or columns) of the semiconductor devices 712, and a plurality of scribe lines 716 separate columns (or rows) of the semiconductor devices 712. The scribe lines 714 may be formed in a first direction (e.g., along the x-axis shown in FIG. 7) in the substrate 710, and the scribe lines 716 may be formed in a second (e.g., perpendicular) direction (e.g., along the y-axis shown in FIG. 7) in the substrate 710 such that the scribe lines 714 and the scribe lines 716 intersect at various locations across the substrate 710. Similarly, the semiconductor devices 722 may be arranged in a grid on the substrate 720 such that a plurality of scribe lines 724 separate rows (or columns) of the semiconductor devices 722, and a plurality of scribe lines 726 separate columns (or rows) of the semiconductor devices 722. The scribe lines 724 may be formed in a first direction (e.g., along the x-axis shown in FIG. 7) in the substrate 720, and the scribe lines 726 may be formed in a second (e.g., perpendicular) direction (e.g., along the y-axis shown in FIG. 7) in the substrate 720 such that the scribe lines 724 and the scribe lines 726 intersect at various locations across the substrate 720.

As further shown in FIG. 7, each of the scribe lines 714, 716, 724, and 726 may have a particular width along a short dimension of the scribe lines 714, 716, 724, and 726. The scribe lines 714 and 724 may both have a similar width (w1), which may be in a range of approximately 60 microns to approximately 80 microns or in a range of approximately 30 microns to approximately 100 microns, among other examples.

The substrate 710 may be referred to as a low expansion wafer and the substrate 720 may be referred to as a high expansion wafer in that the substrate 720 may have an expansion rate that is greater relative to the expansion rate of the substrate 710. To compensate for the greater thermal expansion of the substrate 720 along the x-axis shown in FIG. 7, the scribe lines 716 and the scribe lines 726 may have widths that are different relative to the width (w1) of the scribe lines 714 and 724. In particular, the widths of the scribe lines 716 may be greater relative to the width (w1) of the scribe lines 714 and 724 since the substrate 710 is a low expansion rate substrate. Moreover, the widths of the scribe lines 726 may be lesser relative to the width (w1) of the scribe lines 714 and 725 (as well as the width of the scribe lines 716) since the substrate 720 is a high expansion rate substrate. As described above, the combination of the greater widths of the scribe lines 716 and the lesser widths of the scribe lines 726 may enable alignment of the semiconductor devices 712 and the semiconductor devices 722 by compensating for larger differences in thermal expansion rates between the substrate 710 and the substrate 720.

The greater widths of the scribe lines 716 and the lesser widths of the scribe lines 726 may result in the semiconductor devices 712 and the semiconductor devices 722 starting out as misaligned along the x-axis (e.g., in the first direction) in a bonding operation to bond the substrate 710 with the substrate 720. However, as the substrate 710 and the substrate 720 are heated in the bonding operation (which causes the substrate 710 and the substrate 720 to expand), the combination of the increased widths of the scribe lines 716, the decreased widths of the scribe lines 726, and the greater expansion rate of the substrate 720 results in the semiconductor devices 712 and the semiconductor devices 722 moving into approximate alignment along the x-axis.

To further promote alignment between the semiconductor devices 712 and the semiconductor devices 722 along the x-axis (e.g., in the first direction), the scribe lines 716 may progressively increase in width from near a center of the substrate 710 toward the edge (or outer perimeter) of the substrate 710. The progressive increase in width may compensate for the increasing expansion rate from near a center of the substrate 720 toward an edge of the substrate 720 along the x-axis (e.g., in the first direction), which may result in greater displacement of semiconductor devices 722 near the edge of the substrate 720 relative to semiconductor devices 722 near the center of the substrate 720 during bonding. Accordingly, the widths of the scribe lines 716 may increase toward the edge of the substrate 710 such that the spacing between the semiconductor devices 712 increases toward the edge of the substrate 710 to compensate for the greater displacement of the semiconductor devices 722 near the edge of the substrate 720 during bonding. In this way, the substrate 710 may include a plurality of subsets of the scribe lines 716, where each subset has a different width relative to other subsets of the scribe lines 716.

As an example, the scribe lines 716 may include a first subset 716a of one or more scribe lines and a second subset 716b of one or more scribe lines. The first subset 716a may be located closer to the center of the substrate 710 relative to the second subset 716b. The width (w2) of the second subset 716b of the scribe lines 716 may be greater relative to the width (w3) of the first subset 716a of the scribe lines 716. In some implementations, the widths of the scribe lines 716 may progressively increase in a range of approximately 1 micron to approximately 4 microns from scribe line to scribe line starting near the center of the substrate 710 and increasing toward the edge of the substrate 710. As an example, if the width (w1) of the scribe lines 714 and 724 are approximately 40 microns, the width (w3) of the first subset 716a may be in a range of approximately 41 microns to approximately 44 microns, the width (w2) of the second subset 716b may be in a range of approximately 42 microns to approximately 48 microns, and so on. In some implementations, the scribe lines 716 include a greater quantity of subsets of progressively increasing widths from near the center of the substrate 710 to near the edge of the substrate 710.

Moreover, the scribe lines 726 may progressively decrease in width from near a center of the substrate 720 toward the edge (or outer perimeter) of the substrate 720. The progressive decrease in width may compensate for the increasing expansion rate from near a center of the substrate 720 toward an edge of the 720 along the x-axis (e.g., in the first direction), which may result in greater displacement of semiconductor devices 722 near the edge of the substrate 720 relative to semiconductor devices 722 near the center of the substrate 720 during bonding. Accordingly, the widths of the scribe lines 726 may decrease toward the edge of the substrate 720 such that the spacing between the semiconductor devices 722 decreases toward the edge of the substrate 720 to compensate for the greater displacement of the semiconductor devices 722 near the edge of the substrate 720 during bonding. In this way, the substrate 720 may include a plurality of subsets of the scribe lines 726, where each subset has a different width relative to other subsets of the scribe lines 726.

As an example, the scribe lines 726 may include a first subset 726a of one or more scribe lines and a second subset 726b of one or more scribe lines. The first subset 726a may be located closer to the center of the substrate 720 relative to the second subset 726b. The width (w4) of the second subset 726b of the scribe lines 726 may be lesser relative to the width (w5) of the first subset 726a of the scribe lines 726. In some implementations, the widths of the scribe lines 726 may progressively decrease in a range of approximately 1 micron to approximately 4 microns from scribe line to scribe line starting near the center of the substrate 720 and decreasing to near the edge of the substrate 720. As an example, if the width (w1) of the scribe lines 714 and 724 are approximately 40 microns, the width (w5) of the first subset 726a may be in a range of approximately 36 microns to approximately 39 microns, the width (w4) of the second subset 726b may be in a range of approximately 32 microns to approximately 38 microns, and so on. In some implementations, the scribe lines 726 include a greater quantity of subsets of progressively increasing widths from near the center of the substrate 720 to near the edge of the substrate 720.

In some implementations, the progressive increase in the widths of the scribe lines 716 are equal in magnitude to the progressive decrease in widths of the scribe lines 726. For example, the widths of the scribe lines 716 may progressively increase in 3 micron increments, and the widths of the scribe lines 726 may decrease in 3 micron decrements. In some implementations, the progressive increase in the widths of the scribe lines 716 and the progressive decrease in widths of the scribe lines 726 are different in magnitude, which may permit more granular tuning of the alignment between the semiconductor devices 712 and the semiconductor devices 722. For example, the widths of the scribe lines 716 may progressively increase in 2 micron increments, and the widths of the scribe lines 726 may decrease in 4 micron decrements.

As indicated above, FIG. 7 is provided as an example. Other examples may differ from what is described with regard to FIG. 7.

Figure 8:
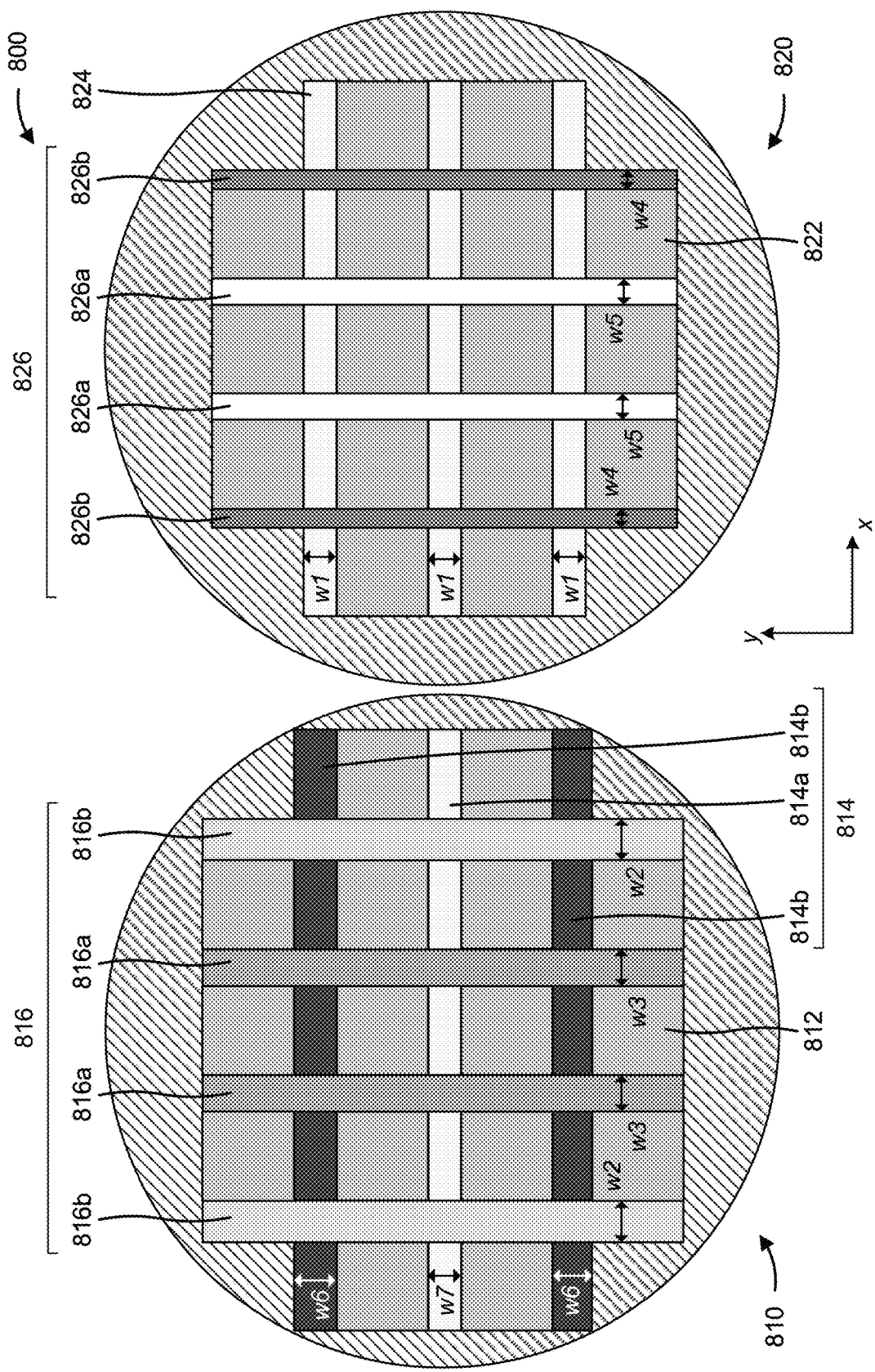

FIG. 8 is a diagram of an example implementation 800 described herein. The example implementation 800 may be similar to the example implementation 700 in that the example implementation 800 includes an example in which a first set of scribe lines of progressively increasing widths are included on a low expansion rate substrate and a second set of scribe lines of progressively decreasing widths are included on a high expansion rate substrate in a first direction. In addition, a third set of scribe lines of progressively increasing widths are included in a second (e.g., approximately perpendicular) direction on the low expansion rate substrate in example implementation 800. The first set of scribe lines, the second scribe lines, and the third set of scribe lines may compensate for asymmetric thermal expansion of the high expansion rate substrate and/or the low expansion rate substrate in that the combination of the first set of scribe lines and the second scribe lines may compensate for larger differences in thermal expansion along a first axis, and the third set of scribe lines may compensate for smaller differences in thermal expansion along a second axis.

As shown in FIG. 8, the example implementation 800 may include a substrate 810 and a substrate 820 that are to be bonded. The substrate 810 and the substrate 820 may be bonded using one or more of the bonding techniques described herein, such as eutectic bonding, fusion (or direct) bonding, hybrid bonding, or another type of semiconductor substrate bonding technique. The substrate 810 may include a plurality of semiconductor devices 812, and the substrate 820 may include a plurality of semiconductor devices 822. The semiconductor devices 812 and 820 may be formed by one or more semiconductor processing techniques described herein. Respective pairs of the semiconductor devices 812 and 822 may be formed into three-dimensional semiconductor devices that include transistors, memory devices, MEMS, ASICs, SoCs, and/or other types of semiconductor devices by bonding the substrate 810 and the substrate 820.

The semiconductor devices 812 may be arranged in a grid on the substrate 810 such that a plurality of scribe lines 814 separate rows (or columns) of the semiconductor devices 812, and a plurality of scribe lines 816 separate columns (or rows) of the semiconductor devices 812. The scribe lines 814 may be formed in a first direction (e.g., along the x-axis shown in FIG. 8) in the substrate 810, and the scribe lines 816 may be formed in a second (e.g., perpendicular) direction (e.g., along the y-axis shown in FIG. 8) in the substrate 810 such that the scribe lines 814 and the scribe lines 816 intersect at various locations across the substrate 810. Similarly, the semiconductor devices 822 may be arranged in a grid on the substrate 820 such that a plurality of scribe lines 824 separate rows (or columns) of the semiconductor devices 822, and a plurality of scribe lines 826 separate columns (or rows) of the semiconductor devices 822. The scribe lines 824 may be formed in a first direction (e.g., along the x-axis shown in FIG. 8) in the substrate 820, and the scribe lines 826 may be formed in a second (e.g., perpendicular) direction (e.g., along the y-axis shown in FIG. 8) in the substrate 820 such that the scribe lines 824 and the scribe lines 826 intersect at various locations across the substrate 820.

The substrate 810 may be referred to as a low expansion wafer and the substrate 820 may be referred to as a high expansion wafer in that the substrate 820 may have an expansion rate that is greater relative to the expansion rate of the substrate 810. To compensate for the greater thermal expansion of the substrate 820 along the x-axis shown in FIG. 8, the scribe lines 816 and the scribe lines 826 may have widths that are different relative to a width (w1) of the scribe lines 824. In particular, the widths of the scribe lines 816 may be greater relative to the width (w1) of the scribe lines 824 since the substrate 810 is a low expansion rate substrate. Moreover, the widths of the scribe lines 826 may be lesser relative to the width (w1) of the scribe lines 824 (as well as the widths of the scribe lines 816) since the substrate 820 is a high expansion rate substrate. As described above, the combination of the greater widths of the scribe lines 816 and the decreased widths of the scribe lines 826 may enable alignment of the semiconductor devices 812 and the semiconductor devices 822 by compensating for larger differences in thermal expansion rates between the substrate 810 and the substrate 820 along the x-axis (e.g., in a direction that is approximately perpendicular to the length of the scribe lines 816 and the scribe lines 826).

To further promote alignment between the semiconductor devices 812 and the semiconductor devices 822 along the x-axis (e.g., in the first direction), the scribe lines 816 may progressively increase in width from near a center of the substrate 810 toward the edge (or outer perimeter) of the substrate 810. The progressive increase in width may compensate for the increasing expansion rate from near a center of the substrate 820 toward an edge of the substrate 820 along the x-axis (e.g., in the first direction), which may result in greater displacement of semiconductor devices 822 near the edge of the substrate 820 relative to semiconductor devices 822 near the center of the substrate 820 during bonding. Accordingly, the widths of the scribe lines 816 may increase toward the edge of the substrate 810 such that the spacing between the semiconductor devices 812 increases toward the edge of the substrate 810 to compensate for the greater displacement of the semiconductor devices 822 near the edge of the substrate 820 during bonding. In this way, the substrate 810 may include a plurality of subsets of the scribe lines 816, where each subset has a different width relative to other subsets of the scribe lines 816.

As an example, the scribe lines 816 may include a first subset 816a of one or more scribe lines and a second subset 816b of one or more scribe lines. The first subset 816a may be located closer to the center of the substrate 810 relative to the second subset 816b. The width (w2) of the second subset 816b of the scribe lines 816 may be greater relative to the width (w3) of the first subset 816a of the scribe lines 816. In some implementations, the widths of the scribe lines 816 may progressively increase in a range of approximately 1 micron to approximately 4 microns from scribe line to scribe line starting near the center of the substrate 810 and increasing to near the edge of the substrate 810. As an example, if the width (w1) of the scribe lines 814 and 824 are approximately 55 microns, the width (w3) of the first subset 816a may be in a range of approximately 56 microns to approximately 59 microns, the width (w2) of the second subset 816b may be in a range of approximately 57 microns to approximately 63 microns, and so on. In some implementations, the scribe lines 816 include a greater quantity of subsets of progressively increasing widths from near the center of the substrate 810 to near the edge of the substrate 810.

Moreover, the scribe lines 826 may progressively decrease in width from near a center of the substrate 820 toward the edge (or outer perimeter) of the substrate 820. The progressive decrease in width may compensate for the increasing expansion rate from near a center of the substrate 820 toward an edge of the 820 along the x-axis (e.g., in the first direction), which may result in greater displacement of semiconductor devices 822 near the edge of the substrate 820 relative to semiconductor devices 822 near the center of the substrate 820 during bonding. Accordingly, the widths of the scribe lines 816 may decrease toward the edge of the substrate 820 such that the spacing between the semiconductor devices 822 decreases toward the edge of the substrate 820 to compensate for the greater displacement of the semiconductor devices 822 near the edge of the substrate 820 during bonding. In this way, the substrate 820 may include a plurality of subsets of the scribe lines 826, where each subset has a different width relative to other subsets of the scribe lines 826.

As an example, the scribe lines 826 may include a first subset 826a of one or more scribe lines and a second subset 826b of one or more scribe lines. The first subset 826a may be located closer to the center of the substrate 820 relative to the second subset 826b. The width (w4) of the second subset 826b of the scribe lines 826 may be lesser relative to the width (w5) of the first subset 826a of the scribe lines 826. In some implementations, the widths of the scribe lines 826 may progressively decrease in a range of approximately 1 micron to approximately 4 microns from scribe line to scribe line starting near the center of the substrate 820 and decreasing toward the edge of the substrate 820. As an example, if the width (w1) of the scribe lines 824 is approximately 55 microns, the width (w5) of the first subset 826a may be in a range of approximately 51 microns to approximately 54 microns, the width (w4) of the second subset 826b may be in a range of approximately 47 microns to approximately 53 microns, and so on. In some implementations, the scribe lines 826 include a greater quantity of subsets of progressively decreasing widths from near the center of the substrate 820 to near the edge of the substrate 820.

In some implementations, the progressive increase in the widths of the scribe lines 816 are equal in magnitude to the progressive decrease in widths of the scribe lines 826. In some implementations, the progressive increase in the widths of the scribe lines 816 and the progressive decrease in widths of the scribe lines 826 are different in magnitude, which may permit more granular tuning of the alignment between the semiconductor devices 812 and the semiconductor devices 822.

To further promote alignment between the semiconductor devices 812 and the semiconductor devices 822 along the y-axis (e.g., in the second direction), the scribe lines 814 may progressively increase in width from near a center of the substrate 810 toward the edge (or outer perimeter) of the substrate 810. The progressive increase in width may compensate for the increasing expansion rate from near a center of the substrate 820 toward an edge of the substrate 820 along the y-axis (e.g., in the second direction), which may result in greater displacement of semiconductor devices 822 near the edge of the substrate 820 relative to semiconductor devices 822 near the center of the substrate 820 during bonding. Accordingly, the widths of the scribe lines 814 may increase toward the edge of the substrate 810 such that the spacing between the semiconductor devices 812 increases toward the edge of the substrate 810 to compensate for the greater displacement of the semiconductor devices 822 near the edge of the substrate 820 during bonding. In this way, the substrate 810 may include a plurality of subsets of the scribe lines 814, where each subset has a different width relative to other subsets of the scribe lines 814.

As an example, the scribe lines 814 may include a first subset 814a of one or more scribe lines and a second subset 814b of one or more scribe lines. The first subset 814a may be located closer to the center of the substrate 810 relative to the second subset 814b. The width (w6) of the second subset 814b of the scribe lines 814 may be greater relative to the width (w7) of the first subset 814a of the scribe lines 814. In some implementations, the widths of the scribe lines 814 may progressively increase in a range of approximately 1 micron to approximately 4 microns from scribe line to scribe line starting from near the center of the substrate 810 and increasing toward the edge of the substrate 810. As an example, if the width (w1) of the scribe lines 824 is approximately 55 microns, the width (w7) of the first subset 814a may be in a range of approximately 56 microns to approximately 59 microns, the width (w6) of the second subset 814b may be in a range of approximately 57 microns to approximately 63 microns, and so on. In some implementations, the scribe lines 814 include a greater quantity of subsets of progressively increasing widths from near the center of the substrate 810 to near the edge of the substrate 810.

As indicated above, the scribe lines 814 and 816 may progressively increase in width from near the center of the substrate 810 toward the edge of the substrate 810 to compensate for actinomorphic thermal expansion of the substrate 820. Accordingly, the increases in the widths of the scribe lines 814 and 816 may be approximately equal to compensate for the radially symmetric thermal expansion of the substrate 820. In some implementations, the increases in the widths of the scribe lines 814 and 816 may be different to compensate for asymmetric thermal expansion of the substrate 810, such as in cases where different types of devices are formed along the x-axis and along the y-axis of the substrate 820 (which may result in asymmetric thermal expansion rates along the x-axis and the y-axis of the substrate 820).

As indicated above, FIG. 8 is provided as an example. Other examples may differ from what is described with regard to FIG. 8.

Figure 9:
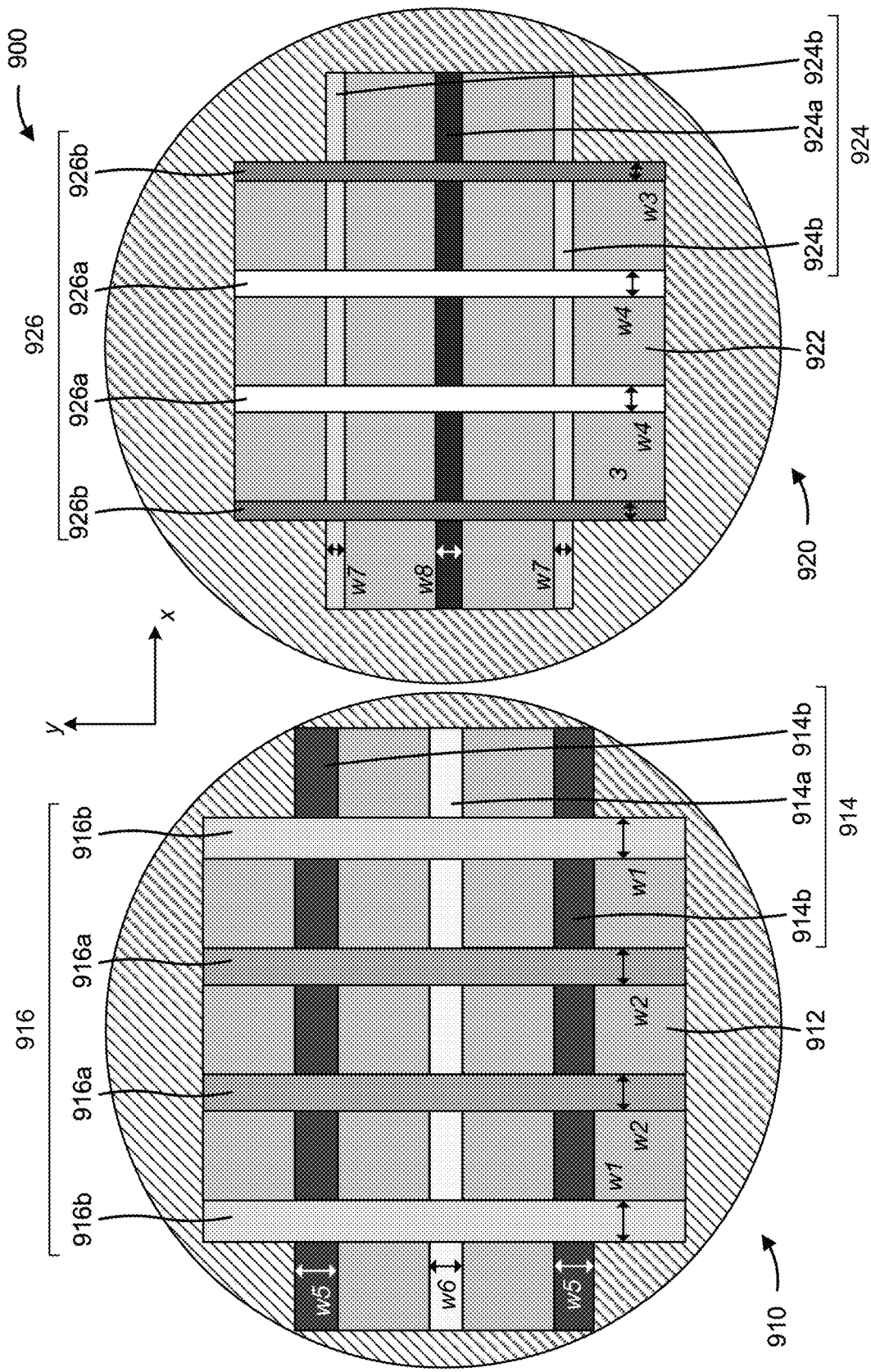

FIG. 9 is a diagram of an example implementation 900 described herein. The example implementation 900 is an example in which a plurality of sets of scribe lines are included in a plurality of directions in each substrate to be bonded. This may enable compensation for larger differences in thermal expansion along a plurality of axes and/or may enable more granular adjustments for semiconductor device alignment.

As shown in FIG. 9, the example implementation 900 may include a substrate 910 and a substrate 920 that are to be bonded. The substrate 910 and the substrate 920 may be bonded using one or more of the bonding techniques described herein, such as eutectic bonding, fusion (or direct) bonding, hybrid bonding, or another type of semiconductor substrate bonding technique. The substrate 910 may include a plurality of semiconductor devices 912, and the substrate 920 may include a plurality of semiconductor devices 922. The semiconductor devices 912 and 920 may be formed by one or more semiconductor processing techniques described herein. Respective pairs of the semiconductor devices 912 and 922 may be formed into three-dimensional semiconductor devices that include transistors, memory devices, MEMS, ASICs, SoCs, and/or other types of semiconductor devices by bonding the substrate 910 and the substrate 920.

The semiconductor devices 912 may be arranged in a grid on the substrate 910 such that a plurality of scribe lines 914 separate rows (or columns) of the semiconductor devices 912, and a plurality of scribe lines 916 separate columns (or rows) of the semiconductor devices 912. The scribe lines 914 may be formed in a first direction (e.g., along the x-axis shown in FIG. 9) in the substrate 910, and the scribe lines 916 may be formed in a second (e.g., perpendicular) direction (e.g., along the y-axis shown in FIG. 9) in the substrate 910 such that the scribe lines 914 and the scribe lines 916 intersect at various locations across the substrate 910. Similarly, the semiconductor devices 922 may be arranged in a grid on the substrate 920 such that a plurality of scribe lines 924 separate rows (or columns) of the semiconductor devices 922, and a plurality of scribe lines 926 separate columns (or rows) of the semiconductor devices 922. The scribe lines 924 may be formed in a first direction (e.g., along the x-axis shown in FIG. 9) in the substrate 920, and the scribe lines 926 may be formed in a second (e.g., perpendicular) direction (e.g., along the y-axis shown in FIG. 9) in the substrate 920 such that the scribe lines 924 and the scribe lines 926 intersect at various locations across the substrate 920.

The substrate 910 may be referred to as a low expansion wafer and the substrate 920 may be referred to as a high expansion wafer in that the substrate 920 may have an expansion rate that is greater relative to the expansion rate of the substrate 910. To compensate for the greater thermal expansion of the substrate 920 along the x-axis shown in FIG. 9, the scribe lines 916 may have widths that progressively increase from near a center of the substrate 910 toward an edge of the substrate 910, and the scribe lines 926 may have widths that progressively decrease from near a center of the substrate 920 toward an edge of the substrate 920. To compensate for the greater thermal expansion of the substrate 920 along the y-axis shown in FIG. 9, the scribe lines 914 may have widths that progressively increase from near the center of the substrate 910 toward the edge of the substrate 910, and the scribe lines 924 may have widths that progressively decrease from near the center of the substrate 920 toward the edge of the substrate 920.

The scribe lines 916 may include a first subset 916a of one or more scribe lines and a second subset 916b of one or more scribe lines. The first subset 916a may be located closer to the center of the substrate 910 relative to the second subset 916b. The width (w1) of the second subset 916b of the scribe lines 916 may be greater relative to the width (w2) of the first subset 916a of the scribe lines 916. In some implementations, the widths of the scribe lines 916 may progressively increase in a range of approximately 1 micron to approximately 4 microns from scribe line to scribe line starting near the center of the substrate 910 and increasing toward the edge of the substrate 910.

The scribe lines 926 may include a first subset 926a of one or more scribe lines and a second subset 926b of one or more scribe lines. The first subset 926a may be located closer to the center of the substrate 920 relative to the second subset 926b. The width (w3) of the second subset 926b of the scribe lines 926 may be lesser relative to the width (w4) of the first subset 926a of the scribe lines 926. In some implementations, the widths of the scribe lines 926 may progressively decrease in a range of approximately 1 micron to approximately 4 microns from scribe line to scribe line starting near the center of the substrate 920 and decreasing toward the edge of the substrate 920.

The scribe lines 914 may include a first subset 914a of one or more scribe lines and a second subset 914b of one or more scribe lines. The first subset 914a may be located closer to the center of the substrate 910 relative to the second subset 914b. The width (w5) of the second subset 914b of the scribe lines 914 may be greater relative to the width (w6) of the first subset 914a of the scribe lines 914. In some implementations, the widths of the scribe lines 914 may progressively increase in a range of approximately 1 micron to approximately 4 microns from scribe line to scribe line starting near the center of the substrate 910 and increasing toward the edge of the substrate 910.

The scribe lines 924 may include a first subset 924a of one or more scribe lines and a second subset 924b of one or more scribe lines. The first subset 924a may be located closer to the center of the substrate 920 relative to the second subset 924b. The width (w7) of the second subset 924b of the scribe lines 924 may be lesser relative to the width (w8) of the first subset 924a of the scribe lines 924. In some implementations, the widths of the scribe lines 924 may progressively decrease in a range of approximately 1 micron to approximately 4 microns from scribe line to scribe line starting near the center of the substrate 920 and decreasing toward the edge of the substrate 920.

In some implementations, the progressive increase in the widths of the scribe lines 916 are equal in magnitude to the progressive decrease in widths of the scribe lines 926. In some implementations, the progressive increase in the widths of the scribe lines 916 and the progressive decrease in widths of the scribe lines 926 are different in magnitude, which may permit more granular tuning of the alignment between the semiconductor devices 912 and the semiconductor devices 922.

In some implementations, the progressive increase in the widths of the scribe lines 914 are equal in magnitude to the progressive decrease in widths of the scribe lines 924. In some implementations, the progressive increase in the widths of the scribe lines 914 and the progressive decrease in widths of the scribe lines 924 are different in magnitude, which may permit more granular tuning of the alignment between the semiconductor devices 912 and the semiconductor devices 922.

As indicated above, FIG. 9 is provided as an example. Other examples may differ from what is described with regard to FIG. 9.

Figure 10A:
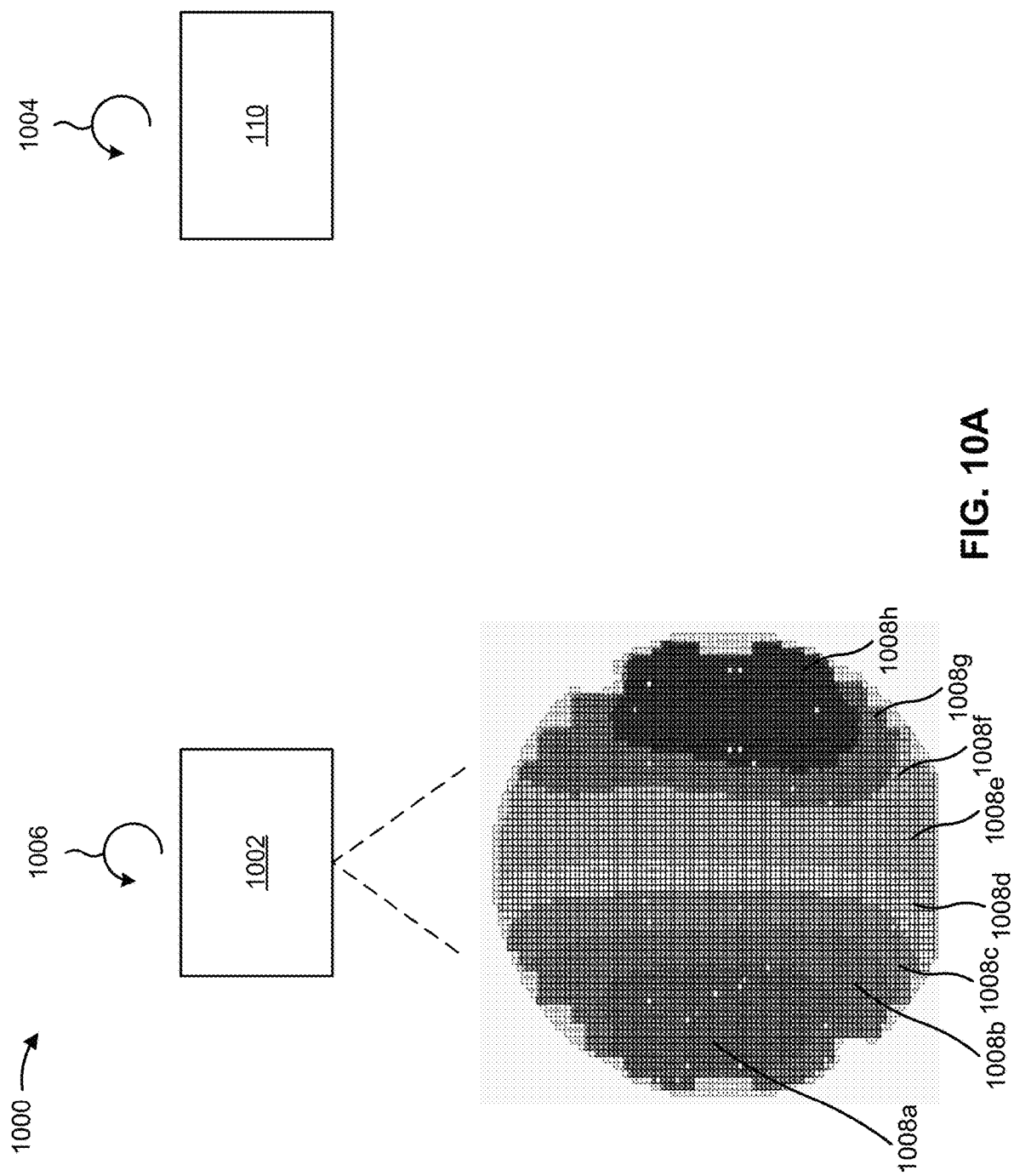

FIGS. 10A-10D are diagrams of an example implementation 1000 described herein. The example implementation 1000 may be an example implementation of bonding a low expansion rate substrate (e.g., one or more of the substrates 210-910) and a high expansion rate substrate (e.g., one or more of the substrates 220-920). As shown in FIG. 10A, the example implementation 1000 may include a processing device 1002. In some implementations, the processing device 1002 includes a processor, a computing device, and/or a controller, among other examples. In some implementations, the processing device 1002 is included in the bonding tool 110. In some implementations, the processing device 1002 is separate from the bonding tool 110 and is communicatively coupled to the bonding tool 110 (e.g., by a direct connection or a network). In some implementations, the processing device 1002 is included in another tool, such as a wafer analysis tool, a scanning electron microscopy (SEM) device, a transmission electron microscopy (TEM) device, and/or another tool.

As further shown in FIG. 10A, and by reference number 1004, the bonding tool 110 may perform a plurality of bonding operations to bond a first plurality of semiconductor devices on a first plurality of substrates (e.g., a plurality of low expansion rate substrates) with a second plurality of semiconductor devices on a second plurality of substrates (e.g., a plurality of high expansion rate substrates). The bonding operations may include fusion bonding operations, eutectic bonding operations, and/or one or more other types of bonding operations.

The processing device 1002 may receive information associated with the plurality of bonding operations. Additional and/or alternatively, the processing device 1002 may generate the information associated with the plurality of bonding operations. The information may include SEM images of the plurality of first substrates and the plurality of second substrates after the plurality of first substrates and the plurality of second substrates are bonded, TEM images of the plurality of first substrates and the plurality of second substrates after the plurality of first substrates and the plurality of second substrates are bonded, and/or other types of information.

As further shown in FIG. 10A, and by reference number 1006, the processing device 1002 may generate thermal expansion data for the first plurality of substrates and thermal expansion data for the second plurality of substrates based on the information associated with the plurality of bonding operations. The first plurality of substrates may include the same type of substrate such that thermal expansion data may be generated across a plurality of bonding operations for the same type of substrate. Similarly, the second plurality of substrates may include the same type of substrate such that thermal expansion data may be generated across a plurality of bonding operations for the same type of substrate.

Thermal expansion data for a plurality of substrates may include respective semiconductor expansion measurements for each of the plurality of substrates. The semiconductor expansion measurements may include, for example, a measurement of an overall expansion in size of a substrate (e.g., a measurement of the increase in diameter of the substrate or a measurement of the increase in a dimension, such as along an axis, of the substrate), a measurement of displacement of a semiconductor device on the substrate (or measurements of respective displacements at different locations of the substrate), and/or one or more other types of expansion measurements. In these examples, the processing device 1002 may perform the semiconductor expansion measurements based on the SEM images and/or the TEM images of the plurality of first substrates and the plurality of second substrates after the plurality of first substrates and the plurality of second substrates are bonded.

In some implementations, the semiconductor expansion measurements include semiconductor device misalignment measurements across a substrate (e.g., from near a center of the substrate to near an edge of the substrate) in one or more directions or along one or more axes. FIG. 10A illustrates an example semiconductor misalignment map generated by the processing device 1002. The example semiconductor misalignment map may visually indicate an amount of misalignment and/or a direction of misalignment for various portions of substrates that were bonded by the bonding tool 110. The amount of misalignment may be indicated as a percentage of misalignment or another parameter, and may be visually indicated in the misalignment map by different color coding, by highlighting, by numbering, by shading, and/or by another visual technique. As an example, the misalignment map shown in FIG. 10A includes a plurality of misalignment regions 1008*a*-1008*h*, where each misalignment region includes a differently colored region in the misalignment map to visually indicate an amount of misalignment and/or a direction of misalignment in the plurality of misalignment regions 1008*a*-1008*h*. In some implementations, the misalignment map may visually indicate an amount of misalignment and/or a direction of misalignment for each individual pair of semiconductor devices that were bonded.

Figure 10B:
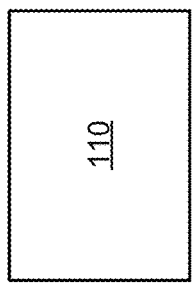
Figure 10B:
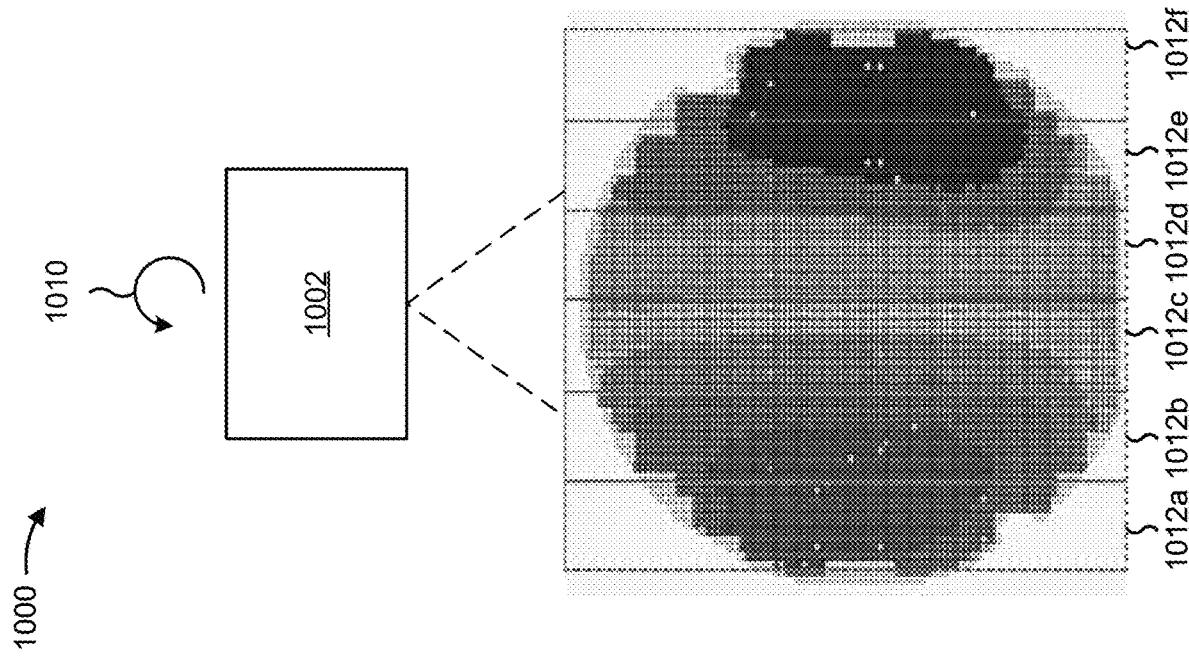

As shown in FIG. 10B, and by reference number 1010, the processing device 1002 may determine adjusted widths for a plurality of scribe lines for bonding a third substrate and a fourth substrate. The third substrate may be the same type of substrate as the first plurality of substrates, and the fourth substrate may be the same type of substrate as the second plurality of substrates, such that the adjusted widths may be used to decrease the misalignment between the semiconductor devices of the third substrate and the fourth substrate. The adjusted widths may be relative to the widths of the scribe lines on the plurality of first substrates and/or on the plurality of second substrates. For example, the processing device 1002 may determine an adjusted width of approximately 84 microns for a scribe line on the third substrate, which may correspond to a scribe line on the plurality of first substrates having a width of approximately 80 microns. The processing device 1002 may determine adjusted widths for one or more of the scribe lines on the plurality of first substrates and/or on the plurality of second substrates. The processing device 1002 may determine the adjusted widths based on the thermal expansion data for the first plurality of substrates and the thermal expansion data for the second plurality of substrates. The adjusted widths may be overlayed on the misalignment map, as shown in the example in FIG. 10B. As an example, the adjusted widths may be visually indicated as a plurality of adjustment regions 1012*a*-1012*f* on the misalignment map, where each adjustment region corresponds to an amount and direction (e.g., an increase in width or a decrease in width) of width adjustment.

In some implementations, the processing device 1002 determines the adjusted widths by determining an adjustment parameter based on the respective semiconductor expansion measurements for each of the first plurality of substrates and the respective semiconductor expansion measurements for each of the second plurality of substrates, and determining the adjusted widths for the plurality of scribe lines based on the adjustment parameter.

As an example, the thermal expansion data for the first plurality of substrates may indicate a substrate expansion of a microns for the first plurality of substrates, and the thermal expansion data for the second plurality of substrates may indicate a substrate expansion of b microns for the second plurality of substrates. The scribe lines across the third substrate (e.g., the low expansion substrate) may be numbered from 1 to x from near the center of the third substrate toward an edge of the third substrate. The processing device 1002 may determine the respective widths of the scribe lines from near the center of the third substrate to near the edge of the third substrate as y+1z, y+2z, . . . y+xz, where y corresponds to the width of an un-adjusted scribe line on the first plurality of substrates and z corresponds to the adjustment parameter for the third substrate. The processing device 1002 may determine the total scribe line increase for the third substrate based on:

$$(1+x)xz/2$$

The processing device 1002 may determine the adjustment parameter (z) such that:

$$\frac{(1+x)xz}{2} = b - a$$

The processing device 1002 may determine respective widths of the scribe lines from near a center of the fourth substrate (e.g., the high expansion substrate) to near an edge of the fourth substrate as y−1z, y−2z, . . . y−xz based on the adjustment parameter.

In some implementations, the processing device 1002 uses machine learning and/or neural network processing for decision making when determining the adjustment parameter and/or the one or more adjusted widths. Machine learning involves computers learning from data to perform tasks and/or to make decisions. Machine learning algorithms are used to train machine learning models based on sample data, known as "training data." Once trained, machine learning models may be used to make predictions, decisions, or classifications relating to new observations. Here, the processing device 1002 may train a machine learning model on the cycle-to-cycle thermal expansion data of the plurality of first substrates and the plurality of second substrates, adjusted widths from one or more historical bonding operations, and/or other types of data. Alternatively, a separate device (e.g., a server device) may train the machine learning model and may provide the trained machine learning model for use by the processing device 1002.

The machine learning model may be trained on the data from thousands (or more) of bonding operations using a supervised learning technique and/or an unsupervised learning technique. In some implementations, the processing device 1002 trains a regression model, a decision tree model, a Naïve Bayes classifier, a k nearest neighbor (KNN) model, or another type of supervised machine learning model by specifying a target or outcome variable that is to be predicted from an independent set of variables. In some implementations, the processing device 1002 uses a neural network (e.g., an artificial neural network that includes thousands or millions (or more) of artificial neurons or processing nodes) to train the machine learning model using a deep learning technique. The nodes in the neural network may be layered and weighted. A node in a layer of the neural network may be connected to a plurality of nodes in a lower layer of the neural network, and may receive a weight from each of the nodes in the lower layer. The node may update the weights and feed forward a weight to one or more nodes in a higher layer in the neural network if the weight satisfies a threshold (which may be referred to as a "firing" of the node). The weights in the neural network may be adjusted and/or updated as the neural network continues to process the training data provided to the machine learning model until similar training data parameters yield similar weights through the neural network.

The machine learning model may generate a function that maps inputs to the machine learning model (e.g., the cycle-to-cycle thermal expansion data of the plurality of first substrates and the plurality of second substrates, adjusted widths from one or more historical bonding operations, and/or other types of data) to specified outputs from the machine learning model (e.g., alignment outcomes for the semiconductor devices included on the third substrate and on the fourth substrate). In this way, the processing device 1002 uses the function (e.g., determined by the machine learning model) to determine the adjustment parameter and/or the one or more adjusted widths.

Figure 10C:
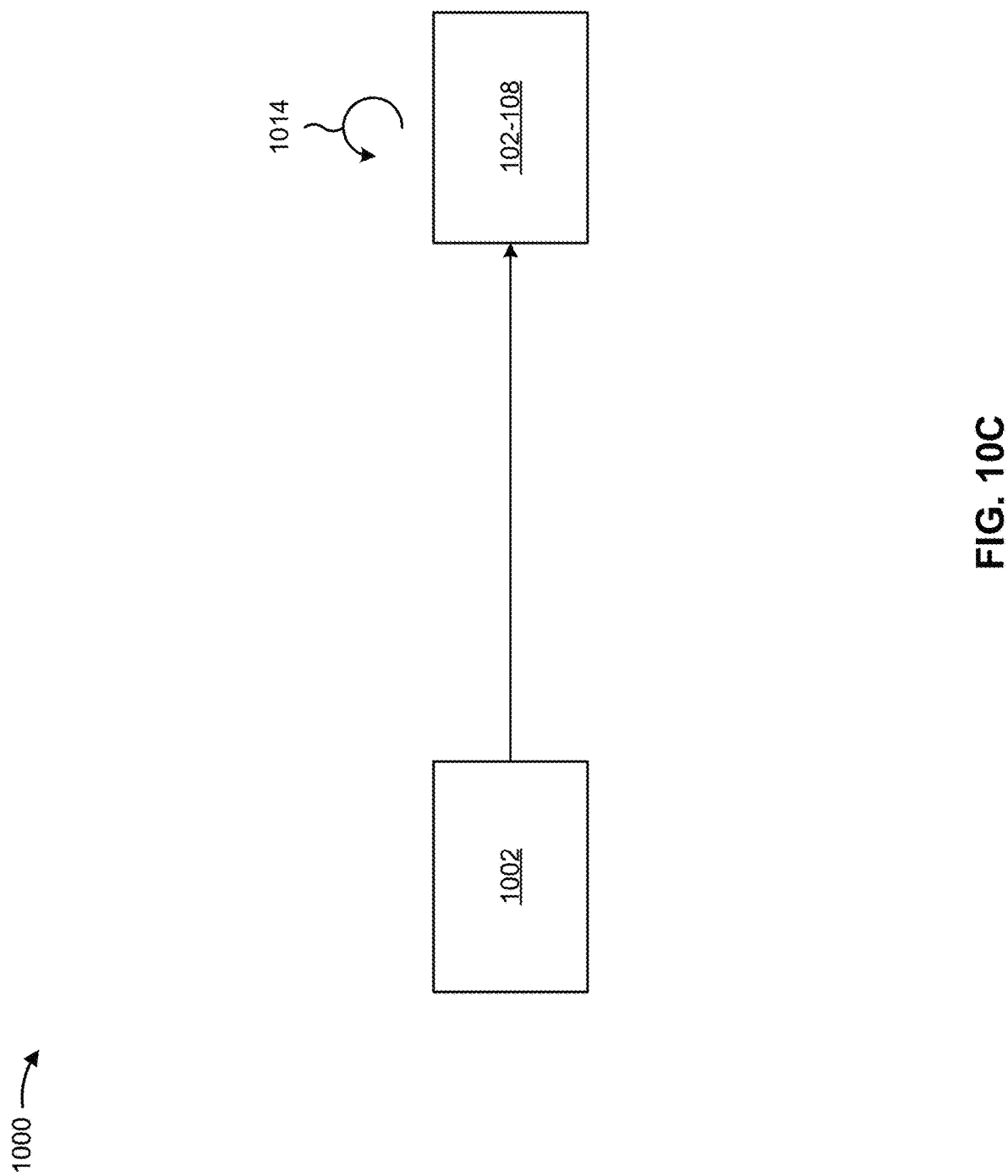

As shown in FIG. 10C, the processing device 1002 may provide an indication of the adjusted widths for forming a plurality of scribe lines for bonding a third substrate and a fourth substrate to one or more semiconductor processing tools (e.g., one or more of the semiconductor processing tools 102-108). As shown by reference number 1014, one or more semiconductor processing tools (e.g., one or more of the semiconductor processing tools 102-108) may form the plurality of scribe lines in the third substrate and/or the fourth substrate based on the adjusted widths. In some implementations, the one or more semiconductor processing tools form the plurality of scribe lines as shown in one or more of the example implementations 200-900 described above. For example, the one or more semiconductor processing tools form the plurality of scribe lines in one or more directions in the third substrate and/or in the fourth substrate such that the plurality of scribe lines progressively increase or progressively decrease to compensate for thermal expansion of the third substrate and thermal expansion of the fourth substrate.

Figure 10D:
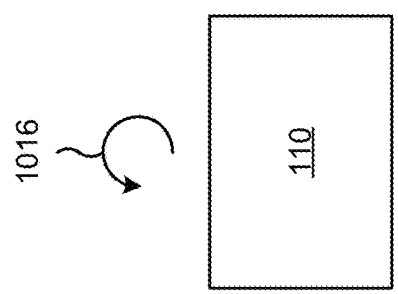
Figure 10D:

As shown in FIG. 10D, and by reference number 1016, the bonding tool 110 may bond the third substrate and the fourth substrate. The bonding tool 110 may bond the third substrate and the fourth substrate after the plurality of scribe lines are formed in the third substrate and/or in the fourth substrate based on the adjusted widths.

As indicated above, FIGS. 10A-10D are provided as an example. Other examples may differ from what is described with regard to FIGS. 10A-10D.

Figure 11:
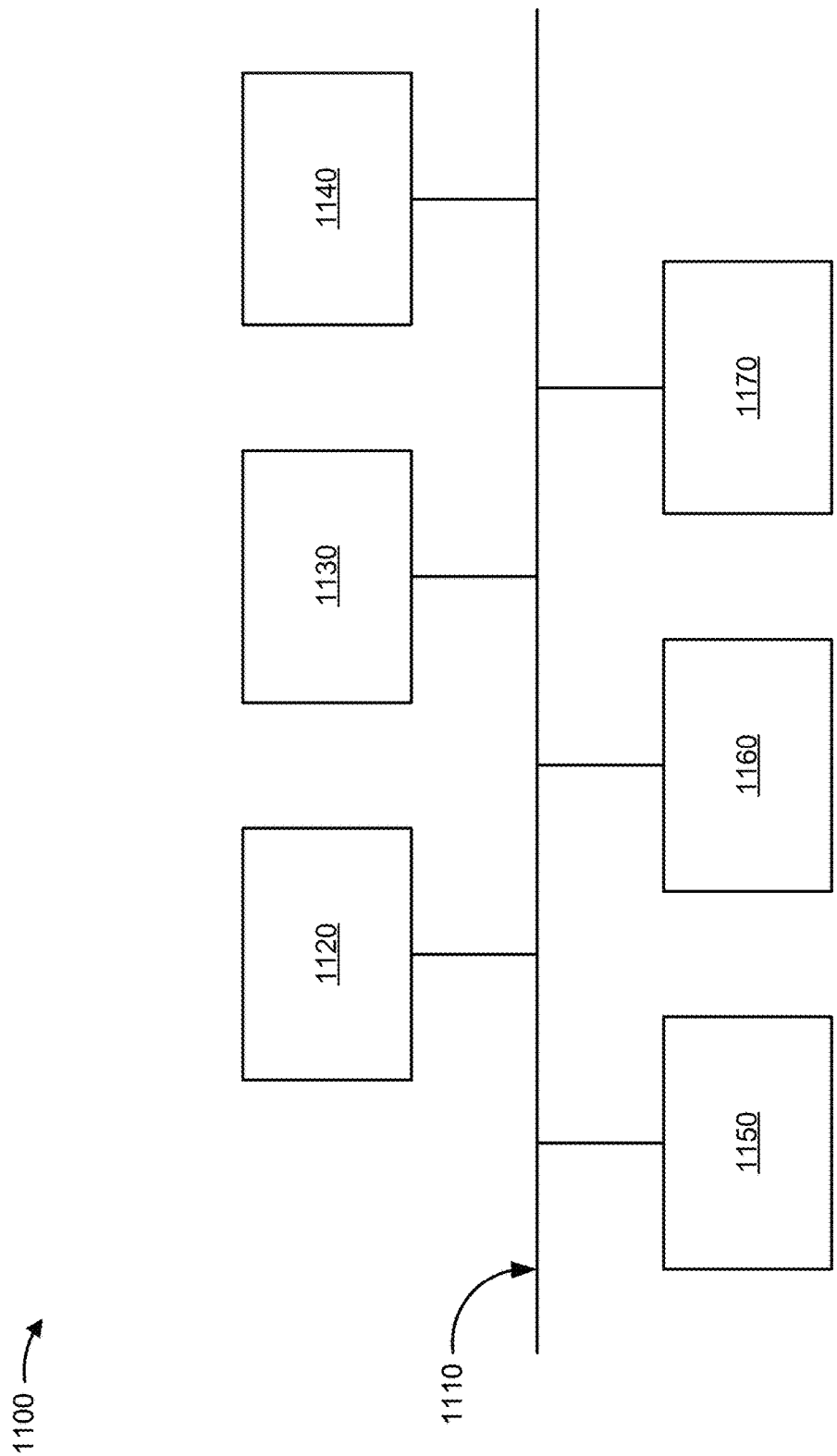
FIG. 11 is a diagram of example components of one or more devices of FIG. 1.

FIG. 11 is a diagram of example components of a device 1100. In some implementations, the semiconductor processing tools 102-110, the wafer/die transport tool 112, and/or the processing device 1002 may include (or may be included in) one or more devices 1100 and/or one or more components of device 1100. As shown in FIG. 11, device 1100 may include a bus 1110, a processor 1120, a memory 1130, a storage component 1140, an input component 1150, an output component 1160, and a communication component 1170.

Bus 1110 includes a component that enables wired and/or wireless communication among the components of device 1100. Processor 1120 includes a central processing unit, a graphics processing unit, a microprocessor, a controller, a microcontroller, a digital signal processor, a field-programmable gate array, an application-specific integrated circuit, and/or another type of processing component. Processor 1120 is implemented in hardware, firmware, or a combination of hardware and software. In some implementations, processor 1120 includes one or more processors capable of being programmed to perform a function. Memory 1130 includes a random access memory, a read only memory, and/or another type of memory (e.g., a flash memory, a magnetic memory, and/or an optical memory).

Storage component 1140 stores information and/or software related to the operation of device 1100. For example, storage component 1140 may include a hard disk drive, a magnetic disk drive, an optical disk drive, a solid state disk drive, a compact disc, a digital versatile disc, and/or another type of non-transitory computer-readable medium. Input component 1150 enables device 1100 to receive input, such as user input and/or sensed inputs. For example, input component 1150 may include a touch screen, a keyboard, a keypad, a mouse, a button, a microphone, a switch, a sensor, a global positioning system component, an accelerometer, a gyroscope, and/or an actuator. Output component 1160 enables device 1100 to provide output, such as via a display, a speaker, and/or one or more light-emitting diodes. Communication component 1170 enables device 1100 to communicate with other devices, such as via a wired connection and/or a wireless connection. For example, communication component 1170 may include a receiver, a transmitter, a transceiver, a modem, a network interface card, and/or an antenna.

Device 1100 may perform one or more processes described herein. For example, a non-transitory computer-readable medium (e.g., memory 1130 and/or storage component 1140) may store a set of instructions (e.g., one or more instructions, code, software code, and/or program code) for execution by processor 1120. Processor 1120 may execute the set of instructions to perform one or more processes described herein. In some implementations, execution of the set of instructions, by one or more processors 1120, causes the one or more processors 1120 and/or the device 1100 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 11 are provided as an example. Device 1100 may include additional components, fewer components, different components, or differently arranged components than those shown in FIG. 11. Additionally, or alternatively, a set of components (e.g., one or more components) of device 1100 may perform one or more functions described as being performed by another set of components of device 1100.

Figure 12:
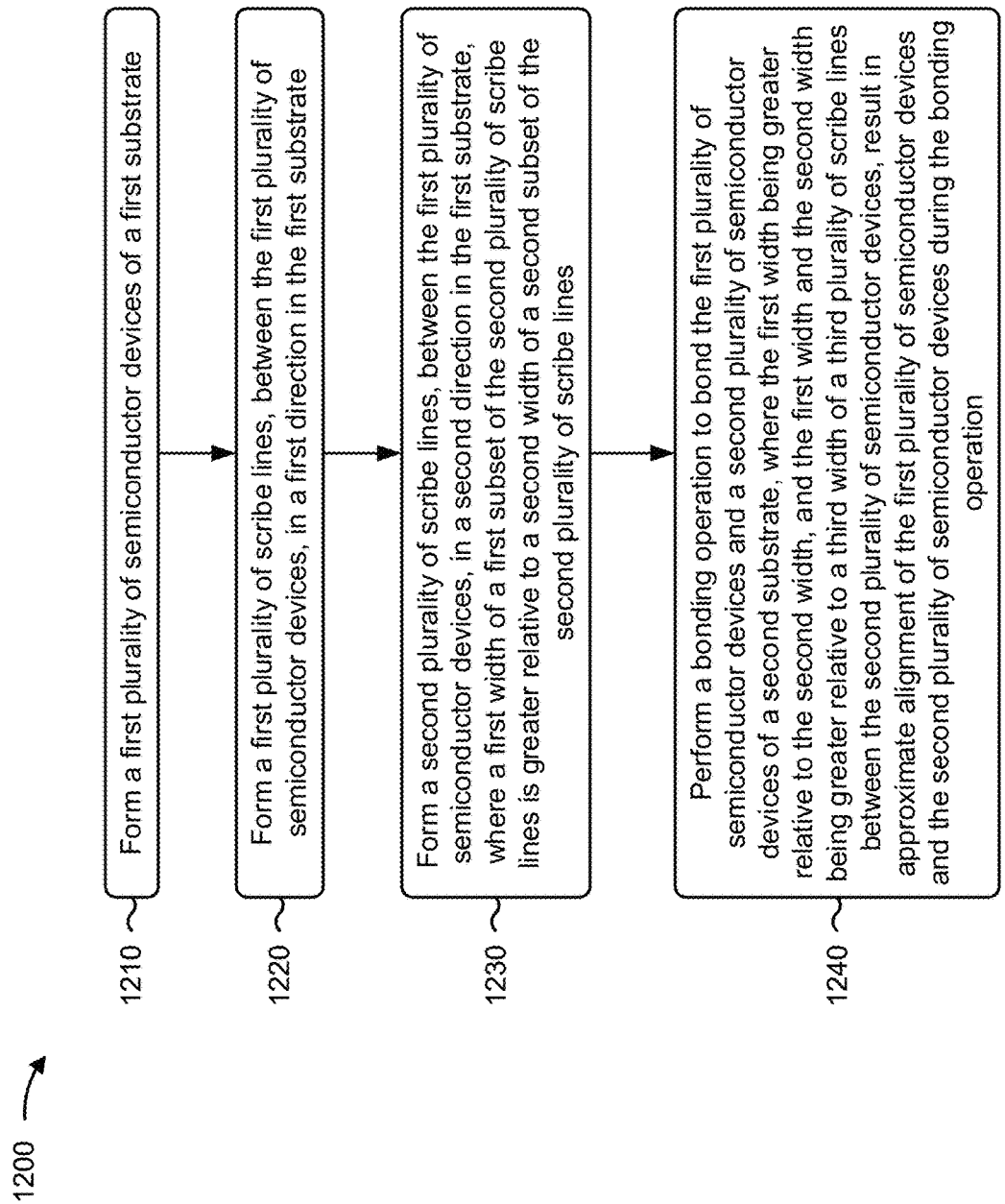

FIG. 12 is a flowchart of an example process 1200 associated with wafer bonding alignment. In some implementations, one or more process blocks of FIG. 12 may be performed by one or more semiconductor processing tools (e.g., the one or more semiconductor processing tools 102-110). In some implementations, one or more process blocks of FIG. 12 may be performed by another device or a group of devices separate from or including the one or more semiconductor processing tools, such as the processing device 1002. Additionally, or alternatively, one or more process blocks of FIG. 12 may be performed by one or more components of device 1100, such as processor 1120, memory 1130, storage component 1140, input component 1150, output component 1160, and/or communication component 1170.

As shown in FIG. 12, process 1200 may include forming a first plurality of semiconductor devices of a first substrate (block 1210). For example, the one or more semiconductor processing tools 102-110 may form a first plurality of semiconductor devices (e.g., the semiconductor devices 212, 312, 612, and/or 712) of a first substrate (e.g., the substrate 210, 310, 610, and/or 710), as described above.

As further shown in FIG. 12, process 1200 may include forming a first plurality of scribe lines, between the first plurality of semiconductor devices, in a first direction in the first substrate (block 1220). For example, the one or more semiconductor processing tools 102-110 may form a first plurality of scribe lines (e.g., the scribe lines 214, 314, 614, and/or 714), between the first plurality of semiconductor devices, in a first direction in the first substrate, as described above.

As further shown in FIG. 12, process 1200 may include forming a second plurality of scribe lines, between the first plurality of semiconductor devices, in a second direction in the first substrate, where a first width of a first subset of the second plurality of scribe lines is greater relative to a second width of a second subset of the second plurality of scribe lines (block 1230). For example, the one or more semiconductor processing tools 102-110 may form a second plurality of scribe lines (e.g., the scribe lines 216, 316, 616, 716), between the first plurality of semiconductor devices, in a second direction in the first substrate, as described above. In some implementations, a first width of a first subset (e.g., the subset 216b, 316b, 616b, and/or 716b) of the second plurality of scribe lines is greater relative to a second width of a second subset (e.g., the subset 216a, 316a, 616a, and/or 716a) of the second plurality of scribe lines.

As further shown in FIG. 12, process 1200 may include performing a bonding operation to bond the first plurality of semiconductor devices and a second plurality of semiconductor devices of a second substrate, where the first width being greater relative to the second width, and the first width and the second width being greater relative to a third width of a third plurality of scribe lines between the second plurality of semiconductor devices, result in approximate alignment of the first plurality of semiconductor devices and the second plurality of semiconductor devices during the bonding operation (block 1240). For example, the one or more semiconductor processing tools 102-110 may perform a bonding operation to bond the first plurality of semiconductor devices and a second plurality of semiconductor devices (e.g., the semiconductor devices 222, 322, 622, and/or 722) of a second substrate (e.g., the substrate 220, 320, 620, and/or 720), as described above. In some implementations, the first width being greater relative to the second width, and the first width and the second width being greater relative to a third width of a third plurality of scribe lines (e.g., the scribe lines 226, 326, 626, and/or 726) between the second plurality of semiconductor devices, result in approximate alignment of the first plurality of semiconductor devices and the second plurality of semiconductor devices during the bonding operation.

Process 1200 may include additional implementations, such as any single implementation or any combination of implementations described below and/or in connection with one or more other processes described elsewhere herein.

In a first implementation, forming the second plurality of scribe lines includes forming the second subset of the second plurality of scribe lines closer to a center of the first substrate relative to the first subset of the second plurality of scribe lines. In a second implementation, alone or in combination with the first implementation, forming the first plurality of scribe lines includes forming the first plurality of scribe lines to a same width as the third width of the third plurality of scribe lines. In a third implementation, alone or in combination with one or more of the first and second implementations, forming the first plurality of scribe lines includes forming a first subset of the first plurality of scribe lines to a fourth width, and forming a second subset of the first plurality of scribe lines to a fifth width, wherein the fifth width is greater relative to the fourth width.

In a fourth implementation, alone or in combination with one or more of the first through third implementations, forming the first plurality of scribe lines comprises forming the first subset of the first plurality of scribe lines and the second subset of the first plurality of scribe lines such that the fourth width and the fifth width are greater relative to a sixth width of a fourth plurality of scribe lines between the second plurality of semiconductor devices. In a fifth implementation, alone or in combination with one or more of the first through fourth implementations, the third plurality of scribe lines are in the second direction in the second substrate, and process 1200 includes forming a fourth plurality of scribe lines (e.g., the scribe lines 624), between the second plurality of semiconductor devices, in the first direction in the second substrate, where a fourth width of a first subset (e.g., the subset 624b) of the fourth plurality of scribe lines is lesser relative to a fifth width of a second subset (e.g., the subset 624a) of the fourth plurality of scribe lines, and where the second subset of the fourth plurality of scribe lines are closer to a center of the second substrate relative to the first subset of the second plurality of scribe lines.

In a sixth implementation, alone or in combination with one or more of the first through fifth implementations, the third plurality of scribe lines are in the second direction in the second substrate, and process 1200 includes forming a fourth plurality of scribe lines (e.g., the scribe lines 726), between the second plurality of semiconductor devices, in the first direction in the second substrate, where a fourth width of a first subset (e.g., the subset 726b) of the fourth plurality of scribe lines is lesser relative to a fifth width of a second subset (e.g., the subset 726a) of the fourth plurality of scribe lines. In a seventh implementation, alone or in combination with one or more of the first through sixth implementations, the second subset of the fourth plurality of scribe lines are closer to a center of the second substrate relative to the first subset of the fourth plurality of scribe lines.

Although FIG. 12 shows example blocks of process 1200, in some implementations, process 1200 may include additional blocks, fewer blocks, different blocks, or differently arranged blocks than those depicted in FIG. 12. Additionally, or alternatively, two or more of the blocks of process 1200 may be performed in parallel.

Figure 13:
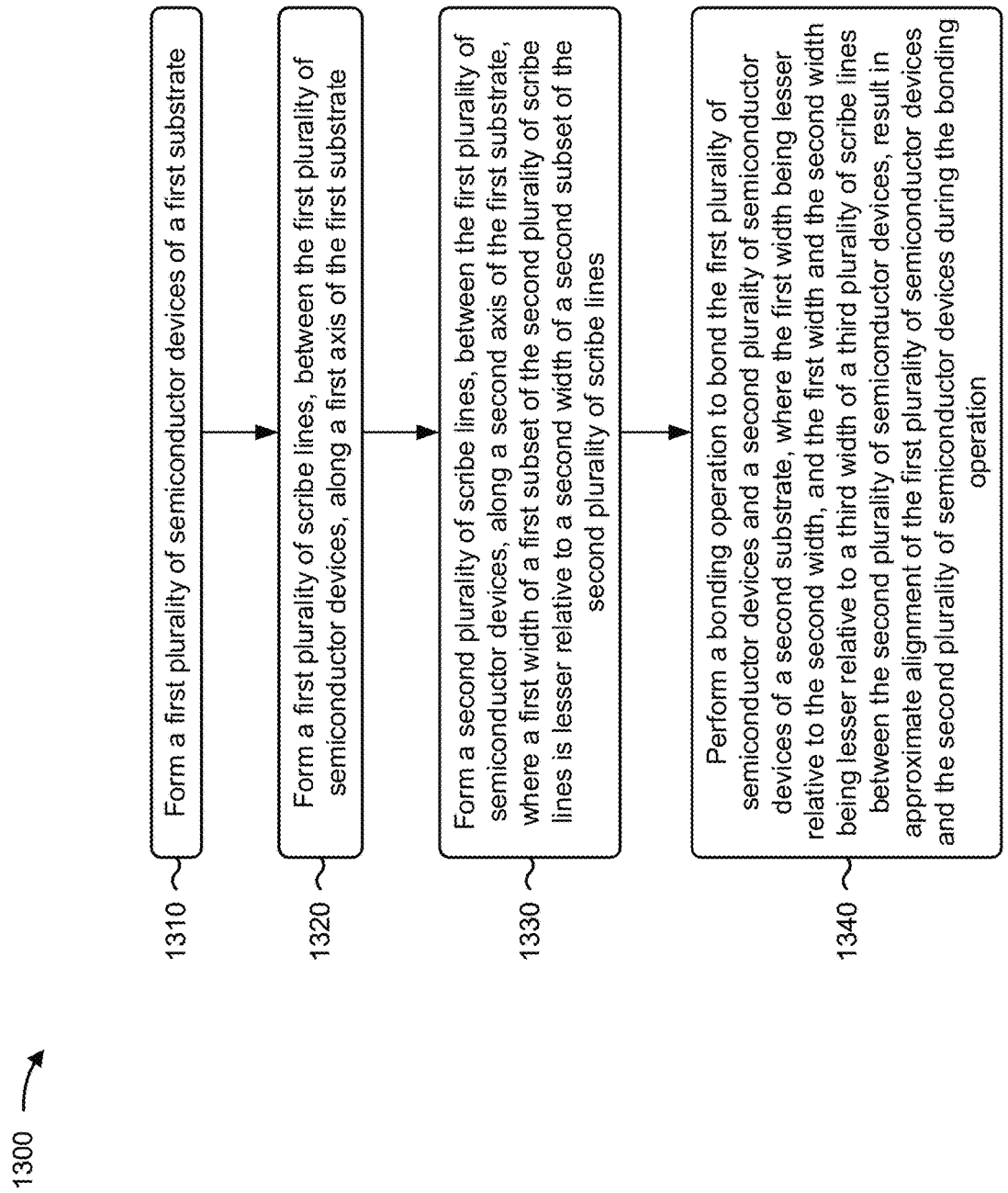

FIG. 13 is a flowchart of an example process 1300 associated with wafer bonding alignment. In some implementations, one or more process blocks of FIG. 13 may be performed by one or more semiconductor processing tools (e.g., the one or more semiconductor processing tools 102-110). In some implementations, one or more process blocks of FIG. 13 may be performed by another device or a group of devices separate from or including the one or more semiconductor processing tools, such as the processing device 1002. Additionally, or alternatively, one or more process blocks of FIG. 13 may be performed by one or more components of device 1100, such as processor 1120, memory 1130, storage component 1140, input component 1150, output component 1160, and/or communication component 1170.

As shown in FIG. 13, process 1300 may include forming a first plurality of semiconductor devices of a first substrate (block 1310). For example, the one or more semiconductor processing tools 102-110 may form a first plurality of semiconductor devices (e.g., the semiconductor devices 422, 522, 822, and/or 922) of a first substrate (e.g., the substrate 420, 520, 820, 920), as described above.

As further shown in FIG. 13, process 1300 may include forming a first plurality of scribe lines, between the first plurality of semiconductor devices, along a first axis of the first substrate (block 1320). For example, the one or more semiconductor processing tools 102-110 may form a first plurality of scribe lines (e.g., the scribe lines 424, 524, 824, and/or 924), between the first plurality of semiconductor devices, along a first axis of the first substrate, as described above.

As further shown in FIG. 13, process 1300 may include forming a second plurality of scribe lines, between the first plurality of semiconductor devices, along a second axis of the first substrate, where a first width of a first subset of the second plurality of scribe lines is lesser relative to a second width of a second subset of the second plurality of scribe lines (block 1330). For example, the one or more semiconductor processing tools 102-110 may form a second plurality of scribe lines (e.g., the scribe lines 426, 526, 826, and/or 926), between the first plurality of semiconductor devices, along a second axis of the first substrate, as described above. In some implementations, a first width of a first subset (e.g., the subset 424b, 524b, 826b, and/or 924b) of the second plurality of scribe lines is lesser relative to a second width of a second subset (e.g., the subset 424a, 524a, 826a, and/or 924a) of the second plurality of scribe lines.

As further shown in FIG. 13, process 1300 may include performing a bonding operation to bond the first plurality of semiconductor devices and a second plurality of semiconductor devices of a second substrate, where the first width being lesser relative to the second width, and the first width and the second width being lesser relative to a third width of a third plurality of scribe lines between the second plurality of semiconductor devices, result in approximate alignment of the first plurality of semiconductor devices and the second plurality of semiconductor devices during the bonding operation (block 1340). For example, the one or more semiconductor processing tools 102-110 may perform a bonding operation to bond the first plurality of semiconductor devices and a second plurality of semiconductor devices (e.g., the semiconductor devices 412, 512, 812, and/or 912) of a second substrate (e.g., the substrate 410, 510, 810, and/or 910), as described above. In some implementations, the first width being lesser relative to the second width, and the first width and the second width being lesser relative to a third width of a third plurality of scribe lines (e.g., the scribe lines 416, 516, 816, and/or 916) between the second plurality of semiconductor devices, result in approximate alignment of the first plurality of semiconductor devices and the second plurality of semiconductor devices during the bonding operation.

Process 1300 may include additional implementations, such as any single implementation or any combination of implementations described below and/or in connection with one or more other processes described elsewhere herein.

In a first implementation, forming the first plurality of scribe lines includes forming a first subset (e.g., the subset 524a) of the first plurality of scribe lines to a fourth width, and forming a second subset (e.g., the subset 524b) of the first plurality of scribe lines to a fifth width, where the fifth width is lesser relative to the fourth width. In a second implementation, alone or in combination with the first implementation, forming the first plurality of scribe lines includes forming the first subset of the first plurality of scribe lines closer to a center of the first substrate relative to the second subset of the first plurality of scribe lines. In a third implementation, alone or in combination with one or more of the first and second implementations, the first width being lesser relative to the second width, and the first width and the second width being lesser relative to the third width, result in approximate alignment of the first plurality of semiconductor devices and the second plurality of semiconductor devices along the second axis, and where the fifth width being lesser relative to the fourth width results in approximate alignment of the first plurality of semiconductor devices and the second plurality of semiconductor devices along the first axis.

In a fourth implementation, alone or in combination with one or more of the first through third implementations, the third plurality of scribe lines are along the second axis in the second substrate, a fourth width of a first subset (e.g., the subset 816b and/or 916b) of the third plurality of scribe lines is greater relative to a fifth width of a second subset (e.g., the subset 816a and/or 916a) of the third plurality of scribe lines, and process 1300 includes forming a fourth plurality of scribe lines (e.g., the scribe lines 814 and/or 914), between the second plurality of semiconductor devices, along the first axis in the second substrate, where a sixth width of a first subset (e.g., the subset 814b and/or 914b) of the fourth plurality of scribe lines is greater relative to a seventh width of a second subset (e.g., the subset 814a and/or 914a) of the fourth plurality of scribe lines. In a fifth implementation, alone or in combination with one or more of the first through fourth implementations, seventh widths of the third plurality of scribe lines increases from a center of the second substrate to an edge of the second substrate.

Although FIG. 13 shows example blocks of process 1300, in some implementations, process 1300 may include additional blocks, fewer blocks, different blocks, or differently arranged blocks than those depicted in FIG. 13. Additionally, or alternatively, two or more of the blocks of process 1300 may be performed in parallel.

FIG. 14 is a flowchart of an example process 1400 associated with wafer bonding alignment. In some implementations, one or more process blocks of FIG. 14 may be performed by one or more semiconductor processing tools (e.g., the one or more semiconductor processing tools 102-110). In some implementations, one or more process blocks of FIG. 14 may be performed by another device or a group of devices separate from or including the one or more semiconductor processing tools, such as the processing device 1002. Additionally, or alternatively, one or more process blocks of FIG. 14 may be performed by one or more components of device 1100, such as processor 1120, memory 1130, storage component 1140, input component 1150, output component 1160, and/or communication component 1170.

As shown in FIG. 14, process 1400 may include receiving information associated with a plurality of bonding operations to bond a first plurality of semiconductor devices on a first plurality of substrates with a second plurality of semiconductor devices on a second plurality of substrates (block 1410). For example, the processing device 1002 may receive information associated with a plurality of bonding operations to bond a first plurality of semiconductor devices (e.g., one or more of the semiconductor devices 212-912) on a first plurality of substrates (e.g., one or more of the substrates 210-910) with a second plurality of semiconductor devices (e.g., one or more of the semiconductor devices 222-922) on a second plurality of substrates (e.g., one or more of the substrates 220-920), as described above. The bonding tool 110 may perform the plurality of bonding operations.

As further shown in FIG. 14, process 1400 may include generating thermal expansion data for the first plurality of substrates and thermal expansion data for the second plurality of substrates based on the information associated with plurality of bonding operations (block 1420). For example, the processing device 1002 may generate thermal expansion data for the first plurality of substrates and thermal expansion data for the second plurality of substrates based on the information associated with the plurality of bonding operations, as described above.

As further shown in FIG. 14, process 1400 may include determining, based on the thermal expansion data for the first plurality of substrates and the thermal expansion data for the second plurality of substrates, adjusted widths for a plurality of scribe lines of at least one of a third substrate or a fourth substrate (block 1430). For example, the processing device 1002 may determine, based on the thermal expansion data for the first plurality of substrates and the thermal expansion data for the second plurality of substrates, adjusted widths for a plurality of scribe lines (e.g., one or more of the scribe lines 214-914, the scribe lines 216-916, the scribe lines 224-924, and/or the scribe lines 226-926) of at least one of a third substrate or a fourth substrate, as described above.

As further shown in FIG. 14, process 1400 may include providing an indication of the adjusted widths to one or more semiconductor processing tools for forming the plurality of scribe lines based on the adjusted widths (block 1440). For example, the processing device 1002 may provide an indication of the adjusted widths to one or more semiconductor processing tools for forming the plurality of scribe lines based on the adjusted widths, as described above. The one or more semiconductor processing tools 102-110 may form the plurality of scribe lines based on the adjusted widths.

Process 1400 may include additional implementations, such as any single implementation or any combination of implementations described below and/or in connection with one or more other processes described elsewhere herein.

In a first implementation, process 1400 includes bonding (e.g., using the bonding tool 110) a third plurality of semiconductor devices on the third substrate with a fourth plurality of semiconductor devices on the fourth substrate after forming the plurality of scribe lines, where the plurality of scribe lines are between at least one of the third plurality of semiconductor devices or the fourth plurality of semiconductor devices. In a second implementation, alone or in combination with the first implementation, the thermal expansion data for the first plurality of substrates includes respective semiconductor expansion measurements for each of the first plurality of substrates, and the thermal expansion data for the second plurality of substrates includes respective semiconductor expansion measurements for each of the second plurality of substrates. In a third implementation, alone or in combination with one or more of the first and second implementations, determining the adjusted widths for plurality of scribe lines includes determining an adjustment parameter based on the respective semiconductor expansion measurements for each of the first plurality of substrates and the respective semiconductor expansion measurements for each of the second plurality of substrates, and determining the adjusted widths for the plurality of scribe lines based on the adjustment parameter.

In a fourth implementation, alone or in combination with one or more of the first through third implementations, forming the plurality of scribe lines includes forming a first subset of the plurality of scribe lines in the third substrate along a first axis, and forming a second subset of the plurality of scribe lines in the third substrate along a second axis approximately perpendicular to the first axis. In a fifth implementation, alone or in combination with one or more of the first through fourth implementations, forming the plurality of scribe lines includes forming a first subset of the plurality of scribe lines in the third substrate, and forming a second subset of the plurality of scribe lines in the fourth substrate.

Although FIG. 14 shows example blocks of process 1400, in some implementations, process 1400 may include additional blocks, fewer blocks, different blocks, or differently arranged blocks than those depicted in FIG. 14. Additionally, or alternatively, two or more of the blocks of process 1400 may be performed in parallel.

In this way, bonding alignment of devices formed on substrates that are to be bonded may be achieved through the use of scribe lines between the devices, where the scribe lines progressively increase or decrease in size from a center to an edge of one or more of the substrates to compensate for differences in the thermal expansion rates of the substrates. The devices on the substrates are brought into alignment as the substrates are heated during a bonding operation due to the progressively increased or decreased sizes of the scribe lines. The scribe lines may be arranged in a single direction in a substrate to compensate for thermal expansion along a single axis of the substrate or may be arranged in a plurality of directions to compensate for actinomorphic thermal expansion. In this way, the techniques and apparatuses described herein may reduce device pattern misalignment, may increase bonding strength between substrates that are bonded, may increase the structural integrity and electrical connections of the devices, and/or may reduce device failures of the substrates.

As described in greater detail above, some implementations described herein provide a method. The method includes forming a first plurality of semiconductor devices of a first substrate. The method includes forming a first plurality of scribe lines, between the first plurality of semiconductor devices, in a first direction in the first substrate. The method includes forming a second plurality of scribe lines, between the first plurality of semiconductor devices, in a second direction in the first substrate, where a first width of a first subset of the second plurality of scribe lines is greater relative to a second width of a second subset of the second plurality of scribe lines. The method includes performing a bonding operation to bond the first plurality of semiconductor devices and a second plurality of semiconductor devices of a second substrate, where the first width being greater relative to the second width, and the first width and the second width being greater relative to a third width of a third plurality of scribe lines between the second plurality of semiconductor devices, result in approximate alignment of the first plurality of semiconductor devices and the second plurality of semiconductor devices during the bonding operation.

As described in greater detail above, some implementations described herein provide a method. The method includes forming a first plurality of semiconductor devices of a first substrate. The method includes forming a first plurality of scribe lines, between the first plurality of semiconductor devices, along a first axis of the first substrate. The method includes forming a second plurality of scribe lines, between the first plurality of semiconductor devices, along a second axis of the first substrate, where a first width of a first subset of the second plurality of scribe lines is lesser relative to a second width of a second subset of the second plurality of scribe lines. The method includes performing a bonding operation to bond the first plurality of semiconductor devices and a second plurality of semiconductor devices of a second substrate, where the first width being lesser relative to the second width, and the first width and the second width being lesser relative to a third width of a third plurality of scribe lines between the second plurality of semiconductor devices, result in approximate alignment of the first plurality of semiconductor devices and the second plurality of semiconductor devices during the bonding operation.

As described in greater detail above, some implementations described herein provide a method. The method includes receiving, by a processing device, information associated with a plurality of operations to bond a first plurality of semiconductor devices on a first plurality of substrates with a second plurality of semiconductor devices on a second plurality of substrates. The method includes generating, by a processing device, thermal expansion data for the first plurality of substrates and thermal expansion data for the second plurality of substrates based on the information associated with the plurality of bonding operations. The method includes determining, by the processing device and based on the thermal expansion data for the first plurality of substrates and the thermal expansion data for the second plurality of substrates, adjusted widths for a plurality of scribe lines of at least one of a third substrate or a fourth substrate. The method includes providing, by the processing device, an indication of the adjusted widths to one or more semiconductor processing tools for forming the plurality of scribe lines based on the adjusted widths.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first plurality of semiconductor devices of a first substrate;
   forming a first plurality of scribe lines, between the first plurality of semiconductor devices, in a first direction in the first substrate;
   forming a second plurality of scribe lines, between the first plurality of semiconductor devices, in a second direction in the first substrate,
      wherein a first width of a first subset of the second plurality of scribe lines is greater relative to a second width of a second subset of the second plurality of scribe lines; and
   performing a bonding operation to bond the first plurality of semiconductor devices and a second plurality of semiconductor devices of a second substrate,
      wherein the first width being greater relative to the second width, and the first width and the second width being greater relative to a third width of a third plurality of scribe lines between the second plurality of semiconductor devices, result in approximate alignment of the first plurality of semiconductor devices and the second plurality of semiconductor devices during the bonding operation.

2. The method of claim 1, wherein forming the second plurality of scribe lines comprises:
   forming the second subset of the second plurality of scribe lines closer to a center of the first substrate relative to the first subset of the second plurality of scribe lines.

3. The method of claim 1, wherein forming the first plurality of scribe lines comprises:
   forming the first plurality of scribe lines to a same width as the third width of the third plurality of scribe lines.

4. The method of claim 1, wherein forming the first plurality of scribe lines comprises:
   forming a first subset of the first plurality of scribe lines to a fourth width; and
   forming a second subset of the first plurality of scribe lines to a fifth width,
      wherein the fifth width is greater relative to the fourth width.

5. The method of claim 4, wherein forming the first plurality of scribe lines comprises:
   forming the first subset of the first plurality of scribe lines and the second subset of the first plurality of scribe lines such that the fourth width and the fifth width are greater relative to a sixth width of a fourth plurality of scribe lines between the second plurality of semiconductor devices.

6. The method of claim 1, wherein the third plurality of scribe lines are in the second direction in the second substrate; and
   wherein the method further comprises:
      forming a fourth plurality of scribe lines, between the second plurality of semiconductor devices, in the first direction in the second substrate,
         wherein a fourth width of a first subset of the fourth plurality of scribe lines is lesser relative to a fifth width of a second subset of the fourth plurality of scribe lines, and
         wherein the second subset of the fourth plurality of scribe lines are closer to a center of the second substrate relative to the first subset of the second plurality of scribe lines.

7. The method of claim 1, wherein the third plurality of scribe lines are in the second direction in the second substrate; and
   wherein the method further comprises:
      forming a fourth plurality of scribe lines, between the second plurality of semiconductor devices, in the first direction in the second substrate,
         wherein a fourth width of a first subset of the fourth plurality of scribe lines is lesser relative to a fifth width of a second subset of the fourth plurality of scribe lines.

8. The method of claim 7, wherein the second subset of the fourth plurality of scribe lines are closer to a center of the second substrate relative to the first subset of the fourth plurality of scribe lines.

9. A method, comprising:
   forming a first plurality of semiconductor devices of a first substrate;
   forming a first plurality of scribe lines, between the first plurality of semiconductor devices, along a first axis of the first substrate;
   forming a second plurality of scribe lines, between the first plurality of semiconductor devices, along a second axis of the first substrate, wherein a first width of a first subset of the second plurality of scribe lines is lesser relative to a second width of a second subset of the second plurality of scribe lines; and performing a bonding operation to bond the first plurality of semiconductor devices and a second plurality of semiconductor devices of a second substrate, wherein the first width being lesser relative to the second width, and the first width and the second width being lesser relative to a third width of a third plurality of scribe lines between the second plurality of semiconductor devices, result in approximate alignment of the first plurality of semiconductor devices and the second plurality of semiconductor devices during the bonding operation.

10. The method of claim 9, wherein forming the first plurality of scribe lines comprises:

forming a first subset of the first plurality of scribe lines to a fourth width; and forming a second subset of the first plurality of scribe lines to a fifth width, wherein the fifth width is lesser relative to the fourth width.

11. The method of claim 10, wherein forming the first plurality of scribe lines comprises:

forming the first subset of the first plurality of scribe lines closer to a center of the first substrate relative to the second subset of the first plurality of scribe lines.

12. The method of claim 10, wherein the first width being lesser relative to the second width, and the first width and the second width being lesser relative to the third width, result in approximate alignment of the first plurality of semiconductor devices and the second plurality of semiconductor devices along the second axis; and wherein the fifth width being lesser relative to the fourth width results in approximate alignment of the first plurality of semiconductor devices and the second plurality of semiconductor devices along the first axis.

13. The method of claim 9, wherein the third plurality of scribe lines are along the second axis in the second substrate;

wherein a fourth width of a first subset of the third plurality of scribe lines is greater relative to a fifth width of a second subset of the third plurality of scribe lines; and wherein the method further comprises:

forming a fourth plurality of scribe lines, between the second plurality of semiconductor devices, along the first axis in the second substrate, wherein a sixth width of a first subset of the fourth plurality of scribe lines is greater relative to a seventh width of a second subset of the fourth plurality of scribe lines.

14. The method of claim 13, wherein seventh widths of the third plurality of scribe lines increases from a center of the second substrate to an edge of the second substrate.

* * * * *